United States Patent
Monangi et al.

(10) Patent No.: US 10,615,812 B2
(45) Date of Patent: Apr. 7, 2020

(54) METHOD AND APPARATUS TO REDUCE EFFECT OF DIELECTRIC ABSORPTION IN SAR ADC

(71) Applicant: Analog Devices Global Unlimited Company, Hamilton (BM)

(72) Inventors: Sandeep Monangi, Srikakulam (IN); Mahesh Madhavan, Calicut (IN)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 16/263,964

(22) Filed: Jan. 31, 2019

(65) Prior Publication Data

US 2019/0173478 A1    Jun. 6, 2019

Related U.S. Application Data

(62) Division of application No. 15/271,697, filed on Sep. 21, 2016, now Pat. No. 10,256,831.

(51) Int. Cl.
| | |
|---|---|
| *H03M 1/12* | (2006.01) |
| *H03M 1/06* | (2006.01) |
| *H03M 1/10* | (2006.01) |
| *H03M 1/46* | (2006.01) |
| *H03M 1/38* | (2006.01) |
| *H03M 3/00* | (2006.01) |

(52) U.S. Cl.
CPC ....... *H03M 1/0617* (2013.01); *H03M 1/1042* (2013.01); *H03M 1/1245* (2013.01); *H03M 1/38* (2013.01); *H03M 1/468* (2013.01); *H03M 3/378* (2013.01)

(58) Field of Classification Search
CPC ........ H03M 1/46; H03M 1/468; H03M 1/466; H03M 1/462; H03M 1/12; H03M 1/124; H03M 1/0617; H03M 1/08; H03M 1/1245; H03M 1/14; H03M 1/0609; H03M 1/0639; H03M 1/0641; H03M 1/121; H03M 1/1225; H03M 1/442

USPC .......................... 341/141, 142, 155, 172, 150
See application file for complete search history.

(56) References Cited

U.S. PATENT DOCUMENTS

| | | | |
|---|---|---|---|
| 2,997,704 A | 8/1961 | Gordon et al. | |
| 6,400,302 B1 | 6/2002 | Amazeen et al. | |
| 7,645,452 B2 | 3/2010 | Madhavan et al. | |
| 7,782,234 B2 | 8/2010 | Ahmad | |
| 8,059,022 B2 | 11/2011 | Cho et al. | |
| 8,604,961 B1 | 12/2013 | Bogner et al. | |
| 8,860,600 B1 * | 10/2014 | Yang ..................... | H03M 1/466 341/172 |

(Continued)

OTHER PUBLICATIONS

"ADS868xA 16-Bit, 500-kSPS, 4- and 8-Channel, Single-Supply, SAR ADCs with Bipolar Input Ranges", (c) 2015,Texas Instruments, ADS8684A, ADS8688A, (Jul. 2015), 80 pgs.

(Continued)

*Primary Examiner* — Linh V Nguyen
(74) *Attorney, Agent, or Firm* — Schwegman Lundberg & Woessner, P.A.

(57) ABSTRACT

A successive approximation register analog to digital converter (SAR ADC) is provided in which impact of dielectric absorption is reduced with a correction circuit configured to adjust a present digital code value signal based at least in part upon a previous digital code value signal, an acquisition time and temperature.

20 Claims, 15 Drawing Sheets

(56) References Cited

U.S. PATENT DOCUMENTS

| | | | |
|---|---|---|---|
| 8,963,752 B2 | 2/2015 | Miura | |
| 9,197,235 B2 | 11/2015 | Thomas | |
| 9,608,652 B2 | 3/2017 | Lee et al. | |
| 10,256,831 B2 | 4/2019 | Monangi et al. | |
| 2004/0034499 A1 | 2/2004 | Regier | |
| 2007/0279095 A1 | 12/2007 | Jian | |
| 2009/0109079 A1 | 4/2009 | Ahmad | |
| 2010/0026546 A1* | 2/2010 | Ohnhaeuser | H03M 1/08 341/172 |
| 2010/0079317 A1* | 4/2010 | Feddeler | H03M 1/1038 341/120 |
| 2010/0127908 A1 | 5/2010 | Carreau et al. | |
| 2011/0001645 A1 | 1/2011 | Messier et al. | |
| 2011/0148675 A1* | 6/2011 | Zhao | H03M 1/1033 341/118 |
| 2012/0262318 A1 | 10/2012 | Straayer et al. | |
| 2012/0280841 A1* | 11/2012 | Wang | H03M 1/1295 341/110 |
| 2012/0326900 A1 | 12/2012 | Wu et al. | |
| 2013/0044014 A1* | 2/2013 | Lin | H03M 1/1061 341/110 |
| 2013/0194121 A1 | 8/2013 | Piasecki | |
| 2013/0249720 A1 | 9/2013 | Matsuura et al. | |
| 2014/0184436 A1 | 7/2014 | Lee et al. | |
| 2014/0232575 A1 | 8/2014 | Le Dortz et al. | |
| 2014/0253352 A1 | 9/2014 | Oshima et al. | |
| 2015/0091746 A1* | 4/2015 | Wang | H03M 1/1245 341/161 |
| 2015/0180498 A1 | 6/2015 | Yang | |
| 2015/0236710 A1 | 8/2015 | Bogner et al. | |
| 2015/0236737 A1 | 8/2015 | Okada et al. | |
| 2015/0256190 A1* | 9/2015 | Takayama | H03M 1/1033 341/118 |
| 2015/0263756 A1* | 9/2015 | Chiu | H03M 1/468 341/118 |
| 2015/0341043 A1 | 11/2015 | Kimura et al. | |
| 2015/0372691 A1 | 12/2015 | Mandal | |
| 2015/0381193 A1 | 12/2015 | Qiu | |
| 2016/0134300 A1* | 5/2016 | Wang | H03M 1/0854 341/172 |
| 2016/0329904 A1 | 11/2016 | Duryea et al. | |
| 2017/0033800 A1* | 2/2017 | Yuan | H03M 1/1245 |
| 2017/0117914 A1 | 4/2017 | Choi | |
| 2018/0083645 A1 | 3/2018 | Monangi et al. | |

OTHER PUBLICATIONS

"U.S. Appl. No. 15/271,697 Preliminary Amendment filed Oct. 5, 2017", 11 pgs.

"U.S. Appl. No. 15/271,697, 312 Amendment filed Jan. 24, 2019", 10 pgs.

"U.S. Appl. No. 15/271,697, Examiner Interview Summary dated Nov. 5, 2018", 3 pgs.

"U.S. Appl. No. 15/271,697, Final Office Action dated Oct. 9, 2018", 15 pgs.

"U.S. Appl. No. 15/271,697, Non Final Office Action dated Jan. 27, 2017", 13 pgs.

"U.S. Appl. No. 15/271,697, Non Final Office Action dated Mar. 28, 2018", 18 pgs.

"U.S. Appl. No. 15/271,697, Notice of Allowance dated Jan. 9, 2019", 10 pgs.

"U.S. Appl. No. 15/271,697, Notice of Allowance dated Jul. 5, 2017", 11 pgs.

"U.S. Appl. No. 15/271,697, Response filed Feb. 6, 2018 to Restriction Requirement dated Dec. 7, 2017", 11 pgs.

"U.S. Appl. No. 15/271,697, Response filed Apr. 27, 2017 to Non Final Office Action dated Jan. 27, 2017", 17 pgs.

"U.S. Appl. No. 15/271,697, Response filed Jul. 12, 2018 to Non Final Office Action dated Mar. 28, 2018", 15 pgs.

"U.S. Appl. No. 15/271,697, Response filed Oct. 31, 2018 to Final Office Action dated Oct. 9, 2018", 12 pgs.

"U.S. Appl. No. 15/271,697, Restriction Requirement dated Nov. 7, 2017", 5 pgs.

Chiu, Po-Yen, et al., "Metal-layer capacitors in the 65 nm CMOS process and the application for low-leakage power-rail ESD clamp circuit", Microelectronics Reliability 54, (2014), 64-70.

Fattaruso, John W., et al., "The Effect of Dielectric Relaxation on Charge-Redistribution A/D/ Converters", IEEE Journal of Solid-State Circuits. 25(6), (1990), 1550-1561.

Kropfitsch', Michael, "Dielectric Absorption of Low-K Materials:Extraction, Modelling and Influence on SAR ADCs", IEEE, (2006), 545-548.

Kugelstadt, Thomas, "The operation of the SAR-ADC based on charge redistribution", Texas Instruments—Data Acquisition, (Feb. 2000), 10-12.

Kundert, Ken, "Modeling Dielectric Absorption in Capacitors", The Designer's Guide Community, Version 26, (Jun. 2008), 1-19.

Li, Quanliang, et al., "A 12-bit compact column-parallel SAR ADC with dynamic power control technique for high-speed CMOS image sensors", Journal of Semiconductors, vol. 35, No. 10, (Oct. 2014), 105008-1 to 105008-8.

Liu, Chun-Cheng, et al., "A 10-bit 50-MS/s SAR ADC With a Monotonic Capacitor Switching Procedure", IEEE Journal of Solid-State Circuits, vol. 45, No. 4, (Apr. 2010), 731-740.

Pease, Robert A., "Understand Capacitor Soakage to Optimize Analog Systems", National Semiconductor, [Online]. Retrieved from the Internet: <URL: http://www.national.com/rap/Application/0,1570, (Oct. 19, 2003), 1-7.

"U.S. Appl. No. 15/271,697, Notice of Allowability dated Mar. 8, 2019", 4 pgs.

"U.S. Appl. No. 15/271,697, PTO Response to Rule 312 Communication dated Feb. 12, 2019", 2 pgs.

* cited by examiner

| Temperature (in °C) | Crosstalk Tone Before Correction (in dB) |
|---|---|
| -40 | -86.29 |
| 25 | -85.1 |
| 125 | -83.43 |

*FIG. 5B*

METHOD AND APPARATUS TO REDUCE EFFECT OF DIELECTRIC ABSORPTION IN SAR ADC

CLAIM OF PRIORITY

This is Application is a Division of U.S. patent application Ser. No. 15/271,697, filed Sep. 21, 2016, the disclosure of which is incorporated by reference herein in its entirety.

BACKGROUND

Analog to digital converters (ADCs) generate multi-bit digital values from analog signals. A successive approximation (SAR) SAR ADC samples an input voltage and compares it to a sequence of voltages to produce a digital representation of the input voltage. A SAR ADC includes at least one capacitor array to produce the sequence of voltages.

Dielectric absorption is an intrinsic property of a capacitor to partially recharge itself shortly after it has been discharged. The dielectric absorption phenomenon is a result of dipole or electrical relaxations in the dielectric material disposed between opposed capacitor pates. In an ideal dielectric, the internal polarization dipoles would form and dissipate instantaneously in response to changes in an applied electric field. In a practical dielectric however, the physical movement of charges responsible for the dipoles takes time, and the length of time required depends on the mechanism for charge displacement. The characteristic time constants associated with dipoles may vary from nanoseconds to hundreds of microseconds.

In a sample and hold circuit, for example, dielectric absorption can be measured by charging a capacitor for a time and then shorting the capacitor, briefly. After removing the short, voltage on the capacitor will tend to recover to some fixed percentage of its original value. This percentage is a measure of dielectric absorption.

Dielectric absorption can result in cross talk between different signal channels that share a SAR ADC through multiplexing, for example. Depending on dielectric relaxation time constants, previously converted input tone can significantly influence signal to noise and distortion ratio (SINAD) during current conversion. In the time domain, dielectric absorption may result in increased latency because of stretching out of capacitor discharge over time.

The amount of dielectric absorption exhibited by a capacitor is highly dependent upon the dielectric material. Materials such as polypropylene, polystyrene, and TEFLON® display low dielectric absorption. Ceramic material exhibits greater dielectric absorption. Silicon dioxide is in between.

SUMMARY

A successive approximation register analog to digital converter (SAR ADC) is provided in which impact of dielectric absorption is reduced with a correction circuit configured to adjust a present digital code value signal based at least in part upon a previous digital code value signal, an acquisition time and temperature.

In one aspect, a SAR ADC can include a binary weighted capacitor array such as can be configured to produce a digital conversion output signal based upon an analog signal input. A dielectric absorption correction circuit can be configured to receive a present conversion output. The correction circuit can include a storage device such as to store a previous conversion output value. The correction circuit can be configured to determine a scaled previous conversion output value such as can be based at least in part upon an analog signal acquisition time and temperature. The correction circuit can be configured to adjust at the present conversion output such as based at least in part upon the determined scaled previous conversion output value.

In another aspect, a method is provided that can reduce dielectric absorption during sampling and bit test stages of a SAR ADC that can include a binary weighted capacitor array configured to produce a digital conversion output signal based upon an analog signal input. The method can include coupling the capacitor array to an analog signal in the course of a present sampling stage and bit testing stage to produce a present conversion output signal value. A previous conversion output signal value can be stored that was produced in the course of a previous sampling stage and bit testing stage. A scaled previous conversion output value can be determined based at least in part upon an analog signal acquisition time and temperature. The present conversion output can be adjusted based at least in part upon the determined scaled previous conversion output value.

In yet another aspect, a SAR ADC is provided that can include a differential comparator a PDAC, an NDAC, and switch circuitry coupled to configure the PDAC and the NDAC for a sampling stage and a bit test stage. Shuffle control switch circuitry can be coupled to shuffle a first capacitor between a coupling of the first capacitor within the PDAC and a coupling of the first capacitor within the NDAC. The shuffle control switch circuitry can be coupled to shuffle a second capacitor between a coupling of the second capacitor within the PDAC and a coupling of the second capacitor within the NDAC.

In still another aspect, a method is provided that can reduce dielectric absorption during sampling and bit test stages of a SAR ADC that can include a PDAC and an NDAC, wherein the PDAC and the NDAC can include equivalent binary weighted capacitor arrays. The method can include shuffling a first capacitor between successive sampling and bit test stages, between a coupling of the first capacitor within the PDAC and a coupling of the first capacitor within the NDAC (108). The method further can include shuffling a second capacitor between successive sampling and bit test stages, between a coupling of the second capacitor within the PDAC and a coupling of the second capacitor within the NDAC.

BRIEF DESCRIPTION OF DRAWINGS

FIG. 5B is an illustrative chart showing an example of crosstalk tone due to dielectric absorption versus temperature in an example multiplexed ADC circuit of FIGS. 3A-3B in accordance with some embodiments.

DESCRIPTION OF EMBODIMENTS

The present inventors have recognized, among other things, that as geometries shrink, dielectric absorption effect becomes more prominent. For smaller geometries, even metal-insulator-metal (MIM) capacitors can experience dielectric absorption. In a digital to analog converter (SAR ADC) embodiment, a previous stored digital conversion value can be scaled based upon acquisition time and temperature to produce a scaled value to use to adjust a later digital conversion value during a successive approximation so as to lessen the impact of dielectric absorption. In another SAR ADC embodiment, capacitors can be shuffled between a positive digital to analog converter (PDAC) and a negative digital to analog converter (NDAC) during successive approximations so as to lessen the impact of dielectric absorption.

Figure 1:
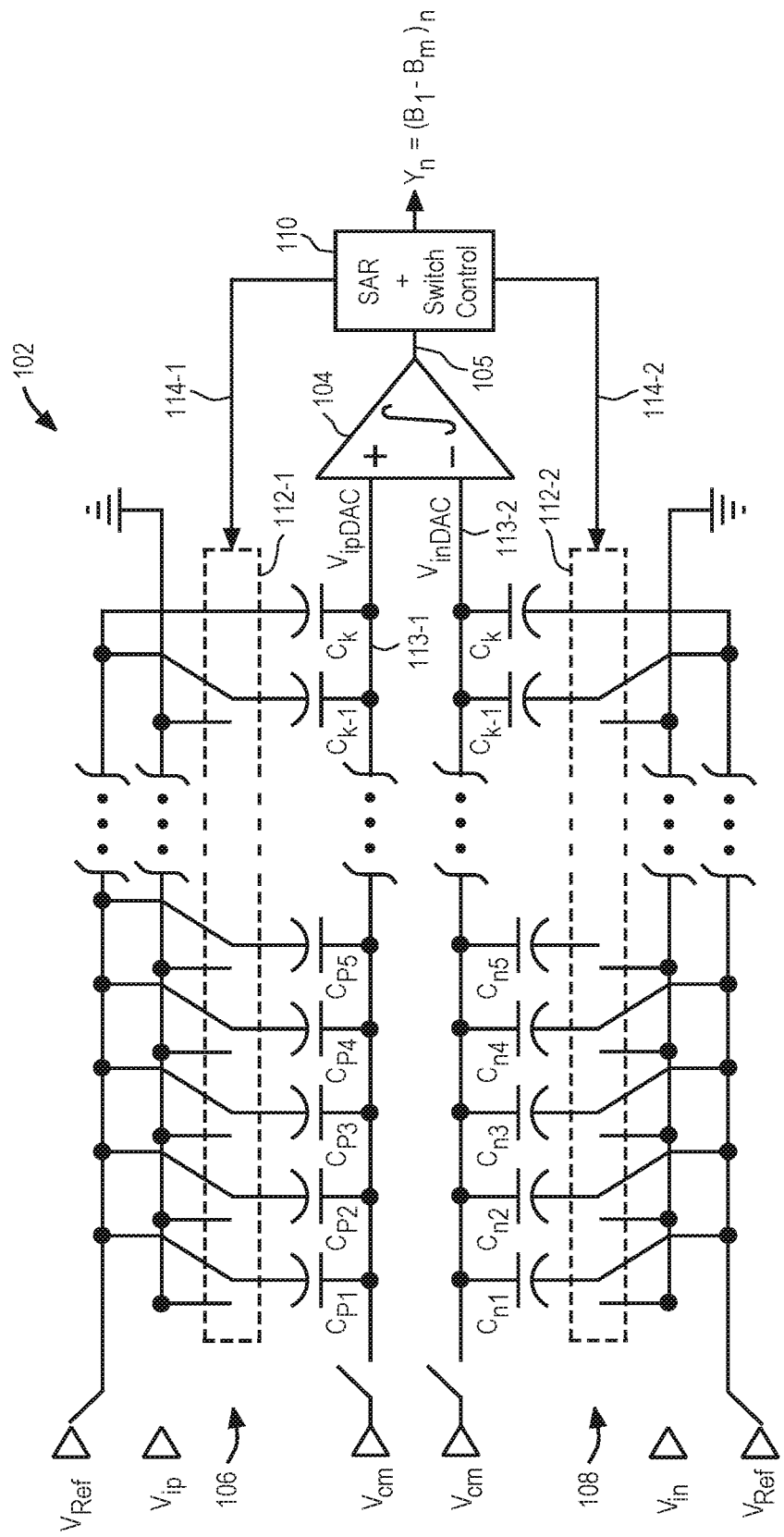
FIG. 1 is an illustrative circuit schematic diagram representing a differential SAR ADC accordance with some embodiments.

FIG. 1 is an illustrative circuit schematic diagram representing a differential SAR ADC 102 in accordance with some embodiments. The differential SAR ADC 102 includes a differential comparator 104, a PDAC (positive DAC) capacitor array 106, an NDAC (negative DAC) capacitor array 108 and a SAR logic and switch control circuit 110 and bit test switches 112-1, 112-2. During a sampling stage, the PDAC 106 receives an input analog signal value $V_{ip}$ and for each bit during a charge-discharge/bit test stage provides an analog PDAC output signal $V_{ipdac}$ at a plus input of the differential comparator 104. During the sampling stage, the NDAC 108 receives an input analog signal value $V_{in}$ and for each bit during the charge-discharge/bit test stage provides an analog NDAC output signal $V_{indac}$ at a minus input of the differential comparator 104. During the charge-discharge/bit test stage, the differential comparator 104 provides on line 105 a binary comparator output signal.

The PDAC 106, an NDAC 108 are equivalent in that they include substantially identical binary weighted capacitor arrays. The differential SAR ADC 102 operates to convert a continuous (analog) input signal value to a multi-bit digital code $Y=(B_0, B_1, \ldots B_m)$. The multi-bit code is built up one-bit code value $B_i$ at a time by comparing a sequence of voltages produced by different combinations of capacitors of the PDAC 106 and the NDAC 108 selected based upon a SAR algorithm. More particularly, the PDAC 106 and the NDAC 108 cooperate to produce a sequence of analog test signal values, $V_{ipdac}$ and $V_{indac}$ on lines 113-1, 113-2, respectively, under control of the switch control circuit 110 circuit logic, that are sequentially provided to the comparator 104, which in turn provides a sequence of individual digital/bit code signal values $B_i$ used to build up the multi-bit code $Y=(B_0, B_1, \ldots B_m)$ that represents the analog input signal. More particularly, the comparator 104 sequentially produces individual digital bit code signal values $B_i$ in response to comparison of the sequence of analog bit test signals, $V_{ipdac}$ and $V_{indac}$, provided by the PDAC 106 and the NDAC 108. The succession of digital bit code signal values $B_i$ provided by the comparator 104 is provided to the SAR switch control circuit 110, which uses them to determine a sequence of switch control feedback signals on lines 114-1, 114-2. The sequence of feedback signals control bit test switches 112-1, 112-2 determines a sequence of capacitor combinations within the PDAC 106 and NDAC 108 to use to generate the sequence of analog bit test signals to provide to the plus $V_{ipdac}$ and minus $V_{indac}$ inputs of the comparator 104 so as to cause the comparator 104 to produce a sequence of digital bit code signal values $B_i$, which is used in turn by the switch control circuit 110 to build up the multi-bit sequence of digital values $Y=(B_0, B_1, \ldots B_m)$ that is provided as output of the switch control circuit 110.

The PDAC 106 includes a first array of binary weighted capacitors $C_{p1}$ to $C_{pk}$. The NDAC 108 includes a second array of binary weighted capacitors $C_{n1}$ to $C_{nk}$. Corresponding capacitors of the PDAC array 106 and the NDAC array 108 are identical. The PDAC 106 and the NDAC 108 each includes an array of capacitors coupled so that the total capacitance of k+1 capacitors in the array is 2C. The capacitors are coupled in parallel. In some embodiments, the capacitors $C_1$ to $C_k$ have weighed values e.g., C, C/2, C/4, ... C/2$^{k-1}$.

The operation of the PDAC 106 and NDAC 108 are complementary. For simplicity, only the PDAC 106 operation is described. During the sampling stage, (second) bottom plates of the capacitors are charged to an input analog signal value $V_{ip}$, and (first) top plates are reset to a common-mode voltage $V_{cm}$. Next, during the charge-discharge/bit test stage in some embodiments, the largest capacitor $C_{p1}$ is switched to $V_{ref}$ and the other capacitors are switched to ground. The comparator 104 then performs a first bit test comparison involving a test voltage value across capacitor $C_{p1}$. If $V_{ipdac}$ is higher than $V_{ref}$ then the switch control circuit 110 sets the MSB to 1, and the largest capacitor $C_{p1}$ remains connected to $V_{ref}$. Otherwise, the switch control circuit 110 sets $B_1$ to 0, and the largest capacitor $C_p$i is reconnected to ground resulting in discharge of the charge on $C_{p1}$. Next, the second largest capacitor $C_{p2}$ is switched to $V_{ref}$. The comparator 104 performs a second bit test comparison, this time involving a test voltage value across capacitor $C_{p2}$. The SAR ADC 102 repeats this procedure until the least significant bit (LSB) is decided. The result is an m bit digital value $B_1$-$B_m$ that represents an analog input signal received as input to the SAR ADC 102.

Digital Solution

Figure 2A:
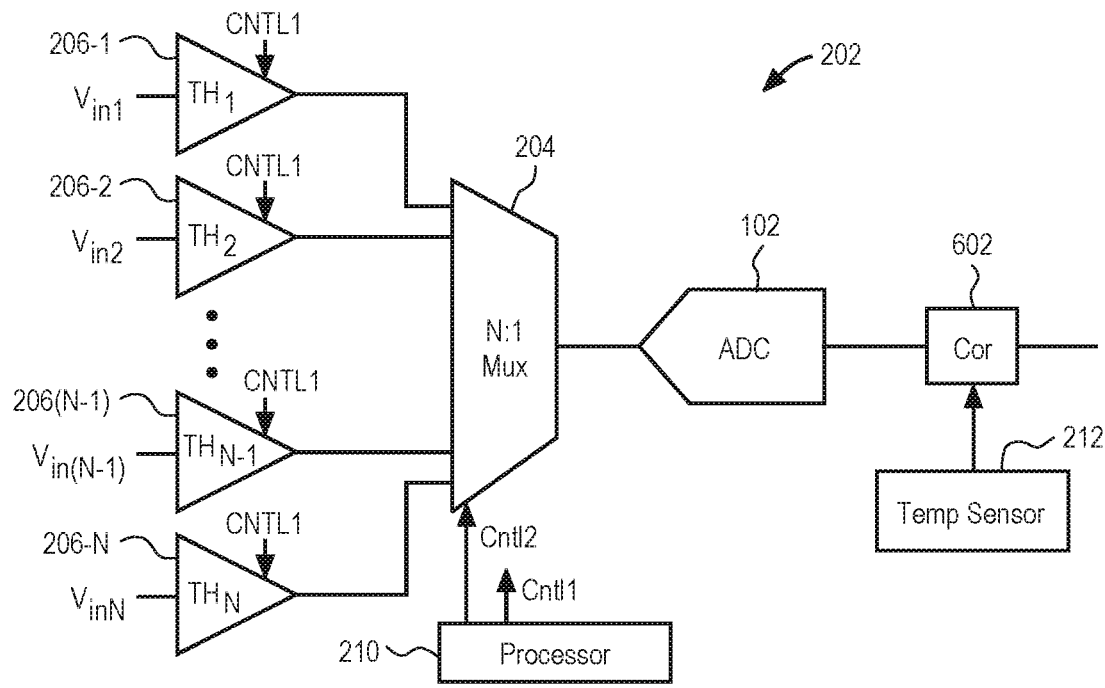
FIGS. 2A-2B are illustrative circuit diagrams showing a first multiplexed ADC circuit 202 coupled to a first digital dielectric absorption correction circuit for converting multiple simultaneously sampled signals (FIG. 2A) and a circuit diagram showing the effective sampling capacitance (FIG. 2B) in accordance with some embodiments.
Figure 2B:
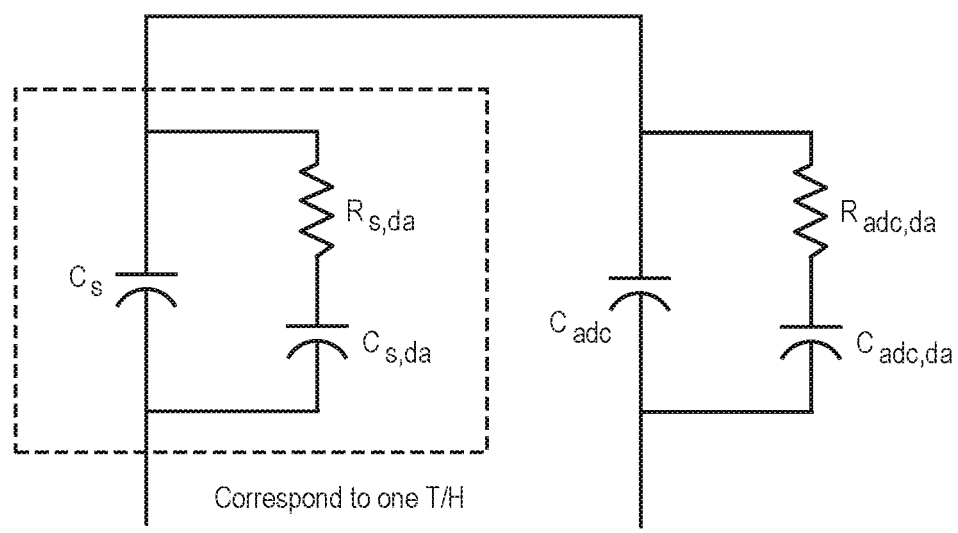

FIGS. 2A-2B are illustrative circuit diagrams showing a first multiplexed ADC circuit 202 coupled to a first digital dielectric absorption correction circuit 602 for converting multiple simultaneously sampled signals (FIG. 2A) and a circuit diagram showing the effective sampling capacitance (FIG. 2B) in accordance with some embodiments. More particularly, the first multiplexed ADC circuit 202 is coupled for converting multiple simultaneously sampled signals, and the first digital dielectric absorption correction circuit 602 is coupled for correcting an output of the ADC circuit 202 outside of a SAR control feedback loop that includes a binary weighted capacitor array. Thus, the first digital dielectric absorption correction circuit 602 is coupled to correct an ADC circuit output signal after its provision by the ADC circuit 202.

Referring to FIG. 2A, the first multiplexed ADC circuit 202 includes a multiplex switch circuit 204, a plurality of track/hold circuits $TH_1$-$TH_N$, 206-1 to 206-N and the ADC 102. The N track/hold circuits $TH_1$-$TH_N$ are coupled to continuously separately track N corresponding analog input signal channels Vin1-$V_{inN}$. In accordance with some embodiments, the N track/hold circuits $TH_1$-$TH_N$ simultaneously capture and hold their respective tracked input signal values. The multiplexer 204 provides the captured signal values one at a time to the ADC 102 for conversion from analog from to digital form. In some embodiments, a processing circuit 210 provides a first control signal Cntl1 to the N track/hold circuits $TH_1$-$TH_N$ to determine times at which to simultaneously capture their respective tracked input signals $V_{in1}$-$V_{inN}$. The processing circuit 210 also provides a second control signal Cntl2 to multiplex circuit 204 to control the order of conversion and time between conversions of signal channels $V_{in1}$-$V_{inN}$. A temperature sensor 212 monitors temperature of the ADC 102 and provides temperature information to the first digital correction circuit 602.

Referring now to FIG. 2B, in some embodiments, at time $t_{n-1}$, the first multiplexed ADC circuit 202 produces output value $Y_{n-1}$. At a later time $t_n$, the first multiplexed ADC circuit 202 produces output value $Y_n$. The capacitance $C_s$ represents sampling capacitance of each T/H and $C_{adc}$ is capacitance of common ADC. The capacitance $C_{s,da}$ along with resistance $R_{s,da}$ represent dielectric absorption model of T/H capacitance $C_s$ and $C_{adc,da}$ along with $R_{adc,da}$ represent dielectric absorption model of ADC capacitance of $C_{adc}$.

Figure 3A:
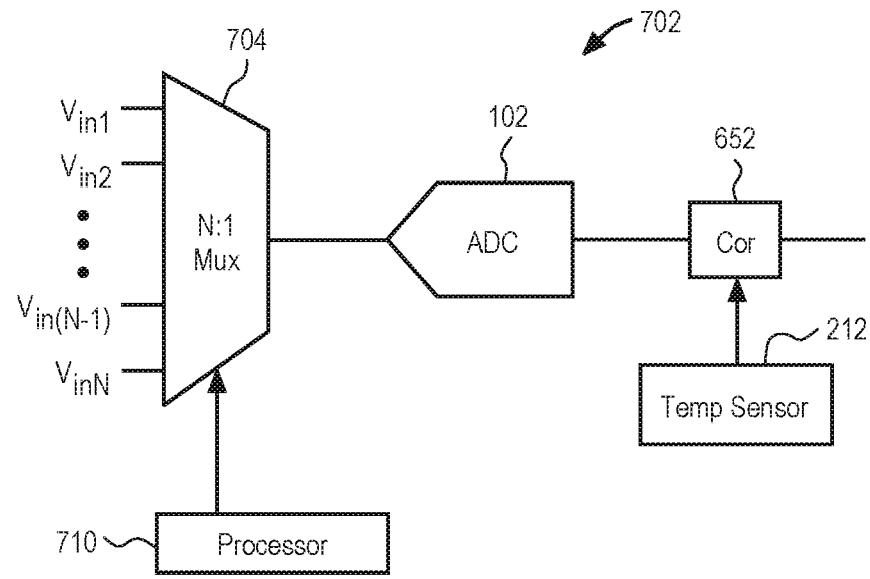
FIGS. 3A-3B are an illustrative circuit schematic diagram showing the multiplexed ADC circuit of FIG. 1 coupled for converting multiple sampled signals (FIG. 3A) and a circuit diagram showing the effective sampling capacitance (FIG. 3B) in accordance with some embodiments.
Figure 3B:
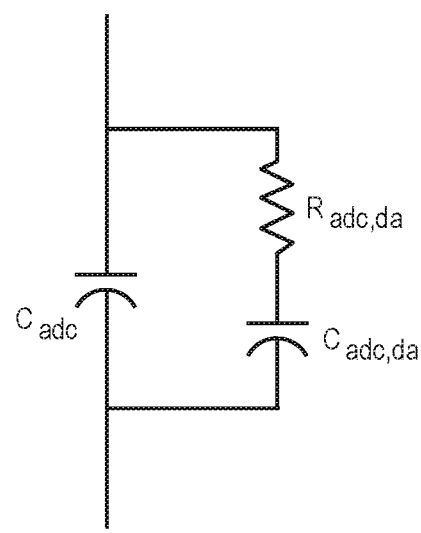

FIGS. 3A-3B are an illustrative circuit schematic diagram showing a second multiplexed ADC circuit 702 coupled to a second digital dielectric absorption correction circuit 652 for sampling and converting multiple signals (FIG. 3A) and a circuit diagram showing the effective sampling capacitance (FIG. 3B) in accordance with some embodiments. The second multiplexed ADC circuit 702 is coupled for converting multiple sampled signals, and the second digital dielectric absorption correction circuit 652 is coupled for correcting an output of the ADC circuit 702 outside of a SAR control feedback loop that includes that includes a binary weighted capacitor array. Thus, the second digital dielectric absorption correction circuit 652 is coupled to correct an ADC circuit output signal after its provision by the ADC circuit 702.

Referring to FIG. 3A, the multiplex switch circuit 704 is configured to receive multiple analog input signals $V_{in1}$-$V_{inN}$ and to selectably provide individual ones of the received input signals to the ADC circuit 102 for conversion from analog to digital form. In some embodiments, the ADC circuit includes the SAR ADC 102 of FIG. 1. A processing circuit 710 provides a control signal cntlx to multiplex circuit 704 to select individual input signals for provision to the ADC 102. In some embodiments, the processing circuitry 710 can dynamically change the timing and/or order in which individual input signals $V_{in1}$-$V_{inN}$ are provided to the ADC 102. A temperature sensor 712 monitors temperature of the ADC 102 and provides temperature information to the second digital correction circuit 652.

Referring now to FIG. 3B, in some embodiments, at time $t_{n-1}$, the second multiplexed ADC circuit 702 produces output value $Y_{n-1}$. At a later time $t_n$, the second multiplexed ADC circuit 702 produces output value $Y_n$. The capacitance $C_{adc}$ is sampling/conversion capacitance of ADC. The capacitance $C_{adc,da}$ along with resistance $R_{adc,da}$ represent dielectric absorption model of ADC capacitance of $C_{adc}$.

Figure 4A:
FIGS. 4A-4B are illustrative drawing showing an example plots of SNR versus frequency for a single converted signal (FIG. 4A) and for a converted signal that includes a spurious signal tone (FIG. 4B).
Figure 4B:
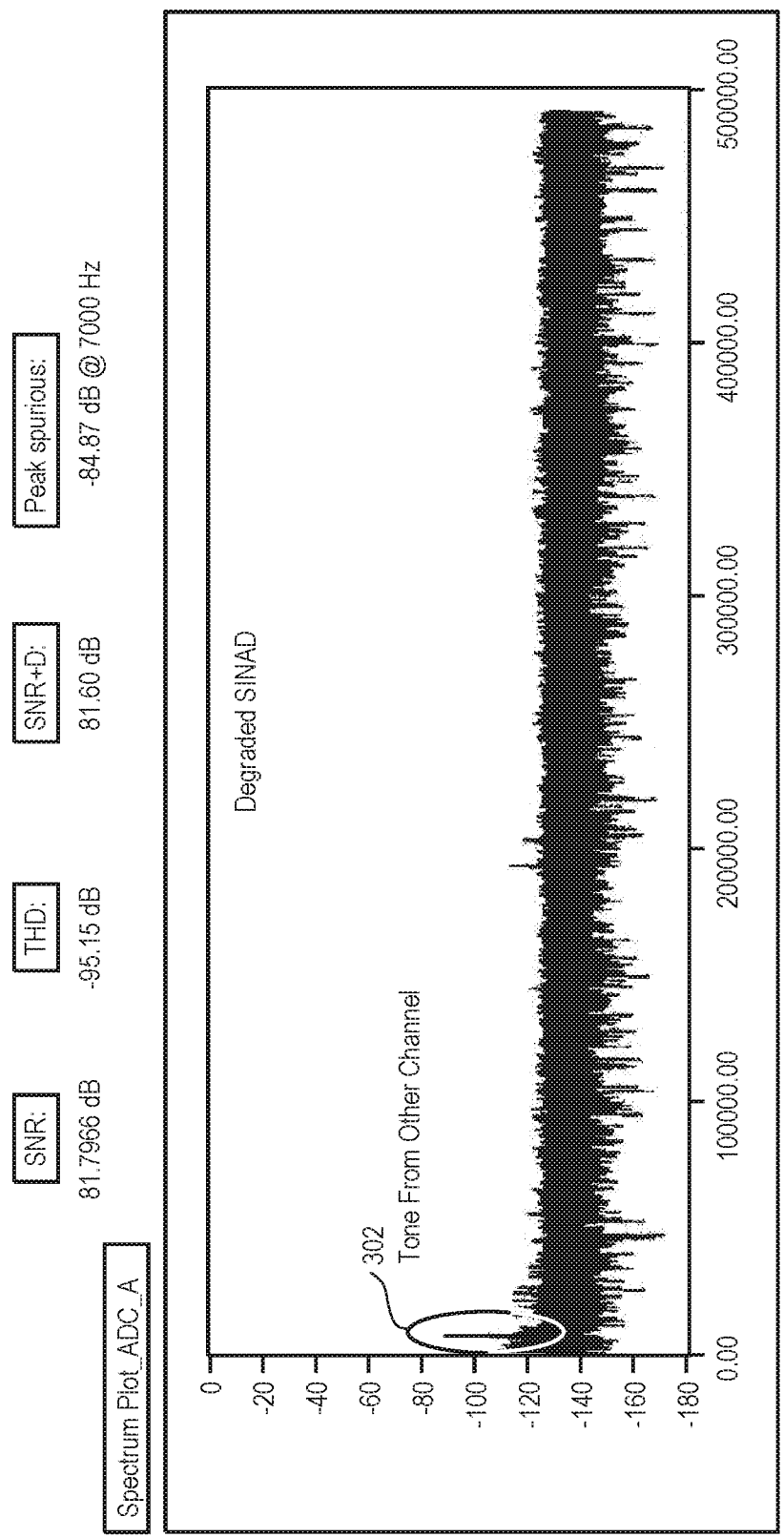

FIGS. 4A-4B are illustrative drawing showing an example plots of SNR versus frequency for a single converted signal (FIG. 4A) and for a converted signal that includes a spurious signal tone 302 caused by residual dielectric absorption due to a previous conversion (FIG. 4B). The first SNR plot shown in FIG. 4A corresponds to a first analog $V_{in1}$ signal sample saved at track/hold circuit $TH_1$ that is selected by the multiplexer 204 and converted by the ADC 102 to a first multi-bit digital value $Y_1=(B_1-B_m)_1$ without any previous signal conversion having occurred within a time period that could leave residual dielectric absorption. It can be seen that no spurious tone is produced due to dielectric absorption left over from a previous conversion. The second SNR plot shown in FIG. 4B corresponds to a first analog $V_{in1}$ signal sample saved at track/hold circuit $TH_1$ that is selected by the multiplexer 204 and converted by the ADC 102 to a first digital value $Y_1=(B_1-B_m)_1$ immediately before a second analog $V_{in2}$ signal sample saved at track/hold circuit $TH_2$ is selected by the multiplexer 204 and converted by the ADC 102 to a second digital value $Y_2=(B_1-B_m)_2$. In that example case, dielectric absorption within a capacitor array of the ADC 102 that results from charge-discharge during conversion of the first analog $V_{in1}$ signal to the first digital value can result in the presence of a spurious tone 302 during the subsequent conversion of the second analog $V_{in2}$ signal to the second digital value.

Figure 5A:
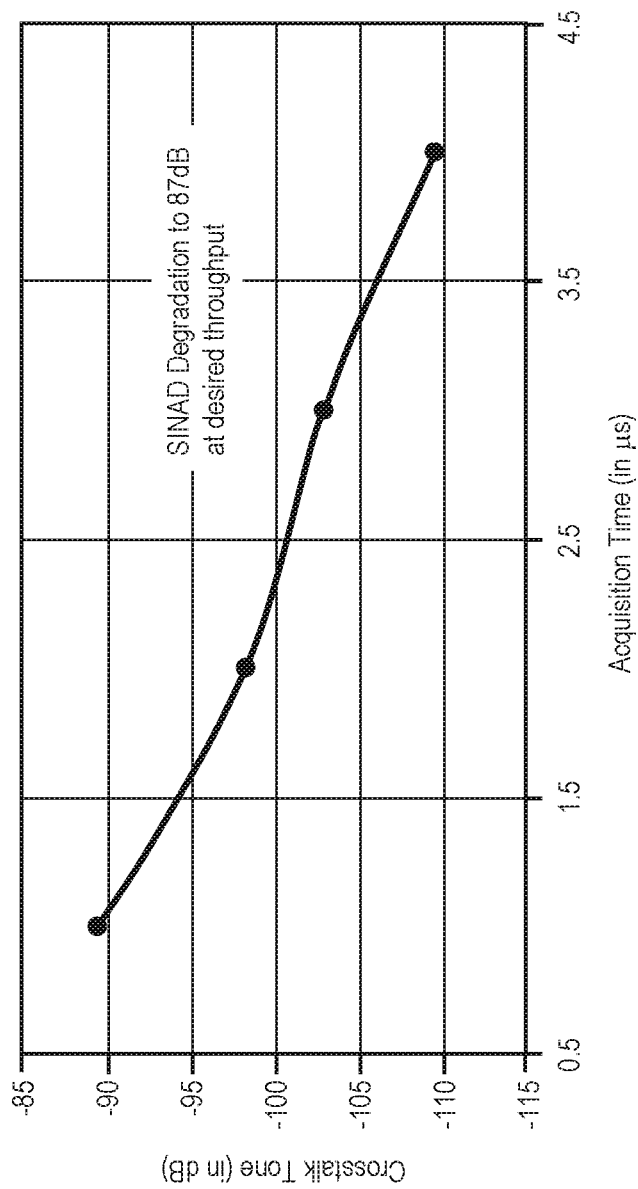
FIG. 5A is an illustrative drawing showing an example plot of crosstalk tone versus acquisition time measured in an example multiplexed ADC circuit of FIGS. 3A-3B in accordance with some embodiments.

FIG. 5A is an illustrative drawing showing an example plot of crosstalk tone versus acquisition time measured in an example multiplexed ADC circuit of FIGS. 3A-3B in accordance with some embodiments. The plot shows a relationship between time between successive conversions and degradation of a signal. More particularly, the plot shows that the shorter the acquisition time between successive conversions, the lower the SNR due to crosstalk. Thus, increased dielectric absorption based crosstalk results in SINAD degradation.

FIG. 5B is an illustrative chart showing an example of crosstalk tone due to dielectric absorption versus temperature in an example multiplexed ADC circuit of FIGS. 3A-3B in accordance with some embodiments. It can be seen that crosstalk increases with increasing temperature.

Figure 6:
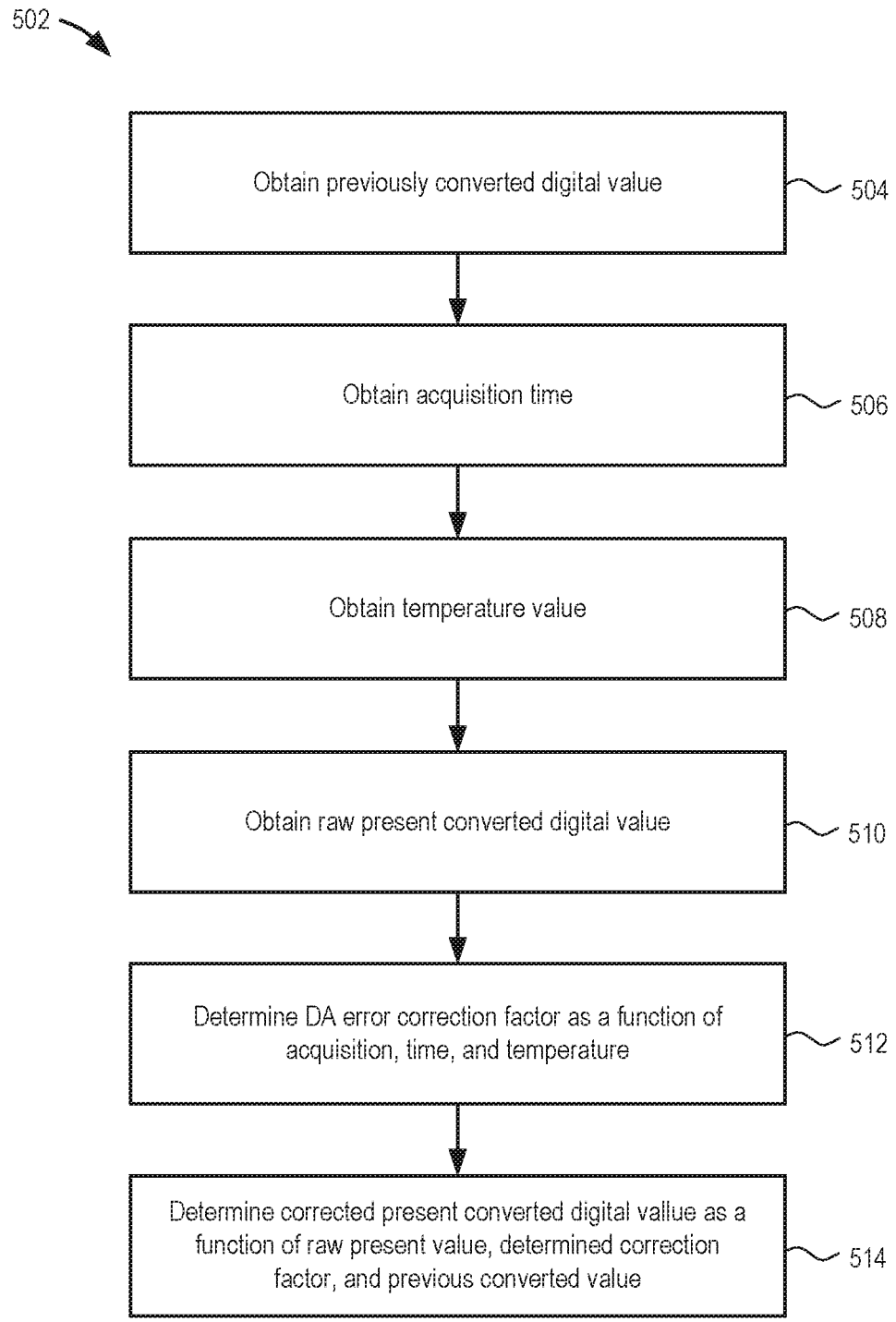
FIG. 6 is an illustrative flow diagram representing a method to remove dielectric absorption error from a raw converted signal based at least in part upon acquisition time in accordance with some embodiments.

FIG. 6 is an illustrative flow diagram representing a method 502 to remove dielectric absorption (DA) error from a raw signal based at least in part upon acquisition time in accordance with some embodiments. In some embodiments, a processing circuit 210, 710 is configured to perform the acts specified below for blocks specified as follows for blocks 504-514. Alternatively, in some embodiments, a dedicated hardware circuit performs such as circuit 602 or 652 performs the acts. In block 504, a previous value that was determined by the ADC 102 from a previous conversion, e.g., $(B_1-B_m)_1$, is obtained. In block 506, an acquisition time interval is determined representing a time between the start of a present conversion and time of completion of an immediate previous conversion. In some embodiments, the acquisition time interval between conversions is a fixed value. In block 508, a temperature value is obtained. In block 510, a raw present value presently determined by the ADC 102 is obtained. In block 512, a DA error correction factor is determined based at least in part upon the determined acquisition time interval and the obtained temperature. In block 514, a corrected present value is determined based at least in part upon the previous value, the raw present value and the determined correction factor.

For example, referring again to the curve of FIG. 5A, for one micro-second acquisition time, crosstalk is approximately −96 dB. Thus, −96 dB represents a cross-talk correction factor for full scale input. Assuming, for example, that a previous value is 3V, then (−96 dB) of 3V will result in a correction value of 47.5 micro-Volts (=3/(20^(−96/20))). Depending on previous output of ADC, corresponding correction factor can be calculated as 47.5 uV*previous Output/3. The correction value is subtracted from a present raw value so as to remove the impact of dielectric absorption and to produce a corrected present value.

Figure 7A:
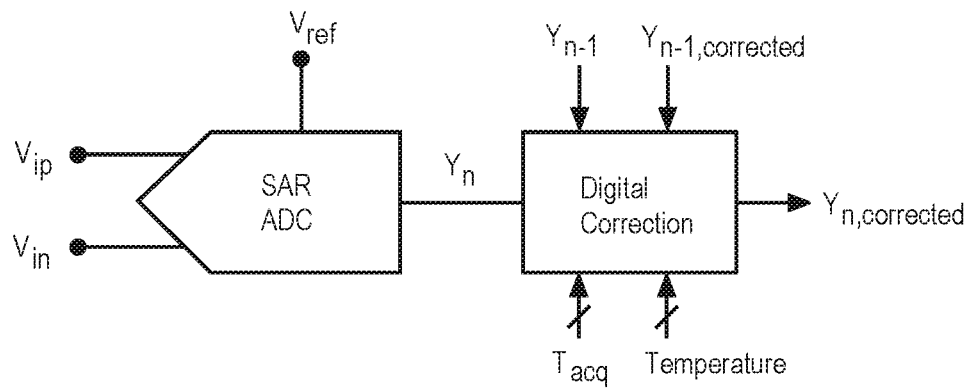
FIG. 7A is an illustrative circuit diagram showing an ADC SAR coupled to a dielectric absorption correction circuit in accordance with some embodiments.
Figure 7B:
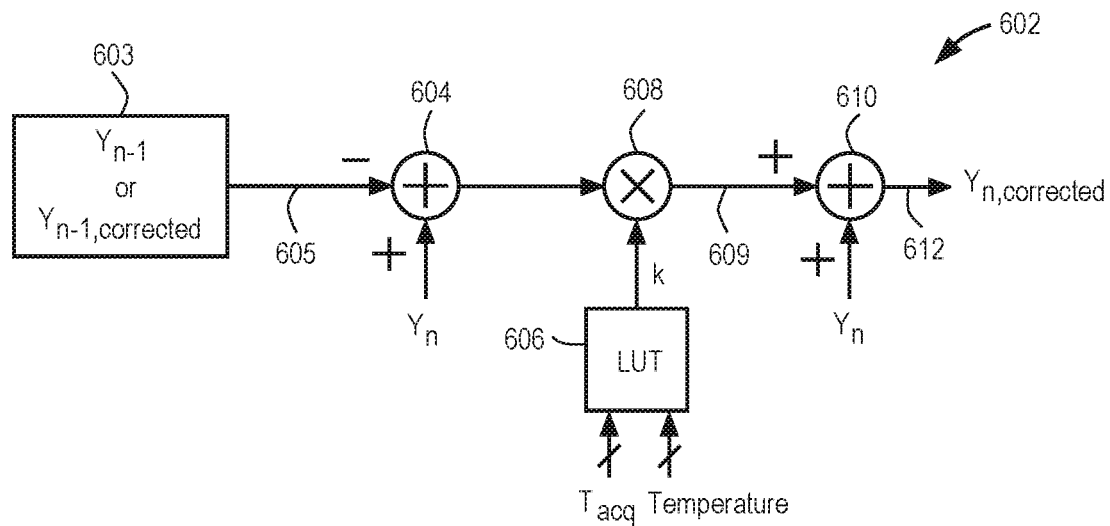
FIG. 7B is an illustrative circuit diagram showing details of a first correction circuit in accordance with some embodiments.
Figure 7C:
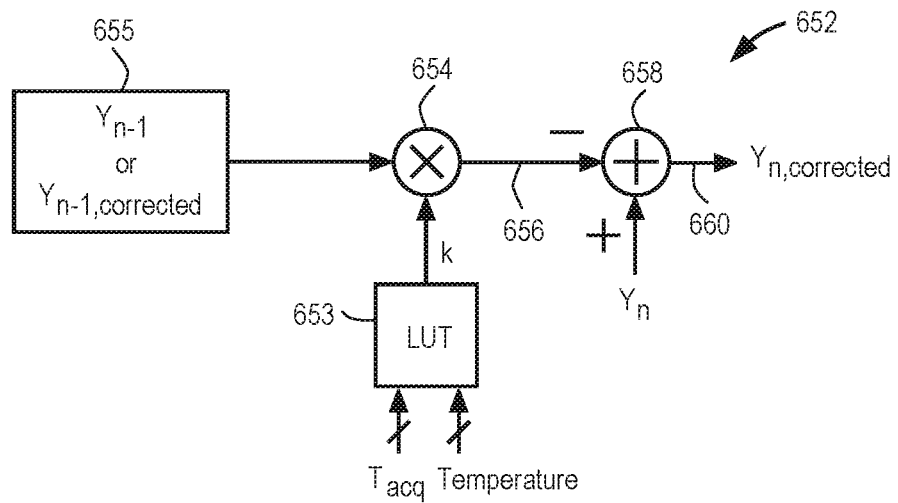
FIG. 7C is an illustrative circuit diagram showing details of a second correction circuit in accordance with some embodiments.

FIG. 7A is an illustrative circuit diagram showing an ADC SAR 102 coupled to a dielectric absorption correction circuit 602 or 652 in accordance with some embodiments. FIG. 7B is an illustrative circuit diagram showing details of the first correction circuit 602 in accordance with some embodiments. FIG. 7C is an illustrative circuit diagram showing details of the second correction circuit 652 in accordance with some embodiments.

Referring to FIG. 7A, the correction circuit 602 or 652 receives as input, signals $Y_n$, $Y_{n-1}$ and $Y_{n-1, corrected}$, where $Y_{n-1, corrected}$ is a corrected version of signal $Y_{n-1}$. The values $Y_{n-1}$ and $Y_{n-1, corrected}$ are saved in a storage device (not shown). It will be appreciated that in accordance with some embodiments one or the other but not both of $Y_{n-1}$ and $Y_{n-1, corrected}$ is provided as an input signal. The correction circuit 602 or 652 also receives as input, an acquisition time signal ($T_{acu}$) and a Temperature signal. The correction circuit 602 or 652 provides as an output, signal $Y_{n, corrected}$.

Referring to FIG. 7B, there is shown an illustrative circuit diagram representing the first dielectric absorption (DA) error correction circuit 602 in accordance with some embodiments. It will be appreciated that in some embodiments, the DA correction circuit 602 can be implemented in a programmed processor and in some embodiments, it can be implemented with dedicated circuit components. More specifically, the DA circuit 602 reduces the impact of DA upon a present raw value $Y_n$ provided to an output of the ADC 102 by computing a corrected value ($Y_{n,corrected}$), based upon acquisition time ($T_{acu}$), temperature, and a previous value ($Y_{n-1}$ or $Y_{n-1,corrected}$) temporarily saved in non-transitory storage device 603. Adder circuit 604 subtracts a previous value ($Y_{n-1}$ or $Y_{n-1, corrected}$) from a present raw value $Y_n$ and produces a subtraction result on line 605. A non-transitory storage device that includes a Look-Up-Table (LUT) 606 outputs a stored correction factor value K selected based upon an acquisition time ($T_{acq}$) and a sensed temperature value. In some embodiments, a stored correction value is determined empirically or though simulation to correct for dielectric absorption as a function of acquisition time and temperature. Multiplication circuit 608 multiplies the subtraction result on line 605 by the correction factor K and produces a product value on line 609. Adder circuit 610 adds the product value on line 609 from the raw value $Y_n$ so as to produce a corrected present value $Y_{n,corrected}$ on line 612. It will be appreciated that in an embodiment in which a previous corrected value ($Y_{n-1,corrected}$) is provided as an input to adder 604, the corrected value ($Y_{n,corrected}$) is saved and fed back for use as the previous corrected value ($Y_{n-1,corrected}$) in a subsequent bit test stage.

Referring to FIG. 7C, there is shown an illustrative circuit diagram representing the second dielectric absorption (DA) error correction circuit 652 to reduce impact of DA error within the circuit of FIGS. 3A-3B in accordance with some embodiments. It will be appreciated that in some embodiments, the correction circuit 652 can be implemented in a programmed processor and in some embodiments, it can be implemented with dedicated circuit components. More specifically, the circuit 652 reduces the impact of DA upon a present raw value $Y_n$ provided to an input of the comparator 104 by computing a corrected present value ($Y_{n,corrected}$), based upon acquisition time ($T_{acu}$), temperature, and a previous value ($Y_{n-1}$ or $Y_{n-1,corrected}$) temporarily stored in non-transitory storage device 655. A non-transitory storage device includes a Look-Up-Table (LUT) 653 that outputs a stored correction factor value K selected based upon an acquisition time ($T_{acq}$) and a sensed temperature value. As stated above, in some embodiments, a stored correction value is determined empirically or though simulation to correct for dielectric absorption as a function of acquisition time and temperature. Multiplication circuit 654 multiplies the previous value ($Y_{n-1}$ or $Y_{n-1,corrected}$) by the correction factor K and produces a product value on line 656. Adder circuit 658 subtracts the product value on line 656 from the raw value $Y_n$ so as to produce a corrected present value $Y_{n, corrected}$ on line 660. It will be appreciated that in an embodiment in which a previous corrected value ($Y_{n-1,corrected}$) is provided as an input to adder 604, the corrected value ($Y_{n,corrected}$) is saved and fed back for use as the previous corrected value ($Y_{n-1,corrected}$) in a subsequent bit test stage.

It will be appreciated that the first and second DA error correction circuits 602, 652 assume that a capacitor has the memory of only an immediate previous input. However, in some embodiments (not shown), depending upon acquisition time/dielectric time constant, a capacitor can have memory of more than one cycle.

In that cases, above dielectric correction circuits can be extended to correct for more than one successive previous value.

Table 1 provides an example of use of digital DA correction to remove the impact of DA error from a raw digital converted value.

TABLE 1

|  | Spurious tone | SINAD | Spurious tone after digital correction | SINAD after digital correction |
|---|---|---|---|---|
| Channel $V_{in1}$ | −93.6 dB @ 8009 Hz | 83.5 dB | N/A | N/A |
| Channel $V_{in2}$ | −85.4 dB @ 1016 Hz | 80.8 dB | −94.1 dB @ 7998 Hz | 82.5 dB |
| Channel $V_{in3}$ | −85.4 dB @ 3017 Hz | 81.5 dB | −93.3 dB @ 8006 Hz | 83.57 dB |

Continuing with the above example based upon the first multiplexed ADC circuit 202 of FIG. 2A, for example, assume that signal channels $V_{in1}$ and $V_{in3}$ are applied an input tone of frequency 1018 Hz and channel Vin is applied an input tone of frequency 3017 Hz. Further, assume that channels $V_{in1}$, $V_{in2}$ and $V_{in3}$ are sampled simultaneously and converted in sequence, one after the other.

Table 1 shows that channel $V_{in1}$ is coupled through DA induced crosstalk to channel $V_{in2}$, and that channel $V_{in2}$ is coupled through DA induced crosstalk to channel $V_{in3}$. However, since the time between channel $V_{in3}$ conversion and channel $V_{in1}$ conversion is longer than a dielectric absorption time constant for the capacitors of the capacitor array of the ADC 102, the channel $V_{in3}$ tone is not visible in spectrum of channel $V_{in1}$.

As discussed above, the strength of channel $V_{in1}$ tone in the channel $V_{in2}$ spectrum is measured, and a corresponding fraction of the channel $V_{in1}$ output is subtracted from the channel $V_{in2}$ output in every conversion. Similarly, the strength of channel $V_{in2}$ tone in the channel $V_{in3}$ spectrum is measured, and a corresponding fraction of the channel $V_{in2}$ output is subtracted from channel $V_{in3}$ output in every conversion. It can be seen that with digital correction in place, SINAD has improved for channels $V_{in2}$ and $V_{in3}$, and it is on par with the channel $V_{in1}$ SINAD. It will be appreciated that a correction factor can be programmed individually for individual ADCs to compensate for device to device variation in dielectric absorption.

Shuffle Solution

Figure 8:
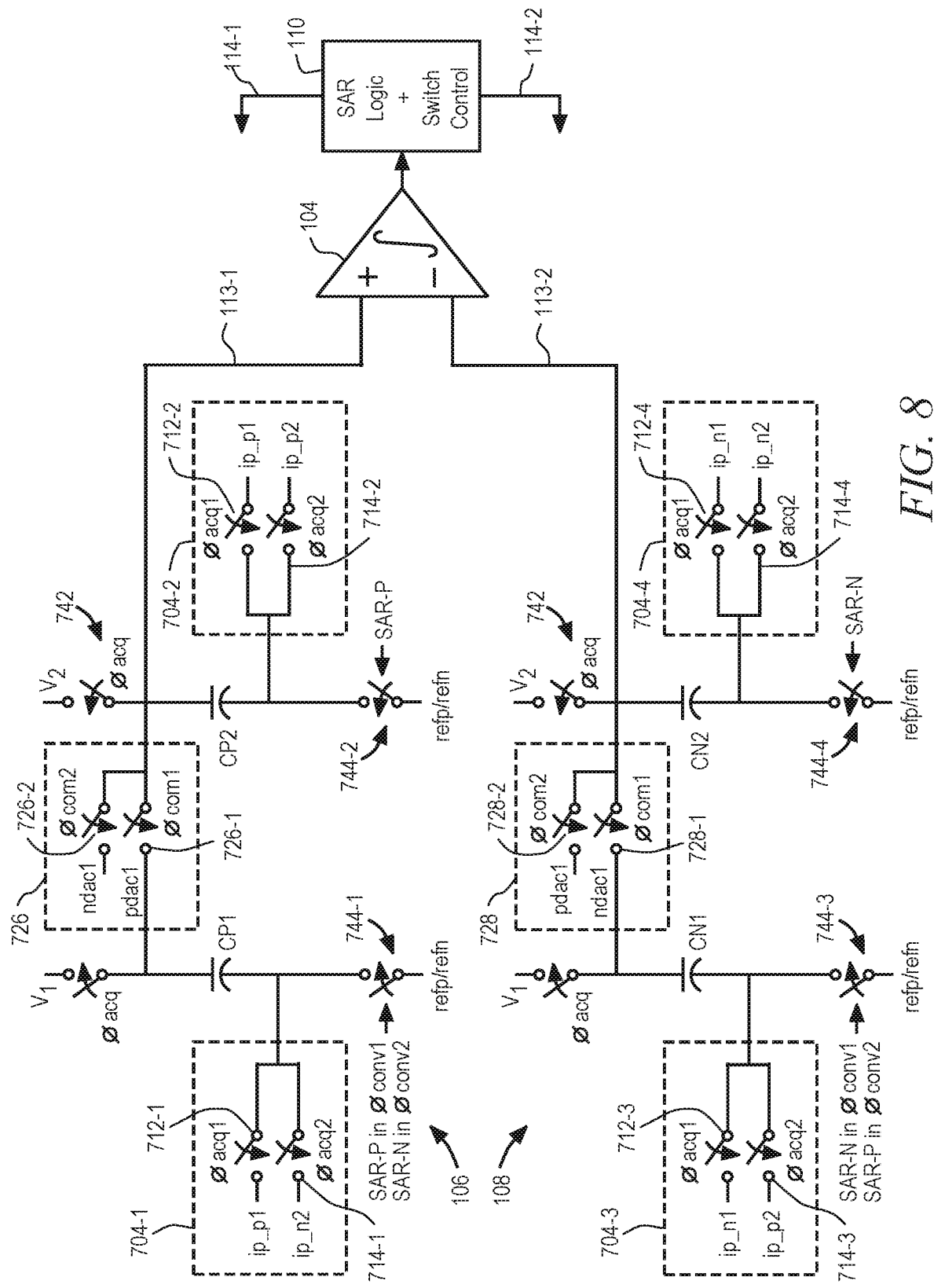
FIG. 8 is an illustrative simplified circuit diagram showing certain details of capacitors and switches within the ADC of FIG. 1 in accordance with some embodiments.

FIG. 8 is an illustrative simplified circuit diagram showing certain details of switches within the ADC circuit 102 of FIG. 1 in accordance with some embodiments. The ADC circuit 102 includes a PDAC 106 and NDAC 108 and comparator circuit 104. The ADC 102 includes capacitor coupling switch circuitry 726, 728 configured to selectably 'shuffle' the coupling of the internal capacitors of the PDAC 106 and the NDAC 108. The ADC 102 also includes and signal routing switch circuitry 704-1 to 704-4 configured to selectably couple differential versions of received analog signals to different internal capacitors of the PDAC 106 and the NDAC 108.

More particularly, the PDAC 106 includes first and second capacitors $C_{P1}$ and $C_{P2}$. The NDAC 108 includes third and fourth capacitors $C_{N1}$ and $C_{N2}$. In some embodiments, one or more of $C_{P1}$, $C_{P2}$, $C_{N1}$ and $C_{N2}$ includes multiple capacitors coupled in parallel. Referring to FIG. 2, for example, in some embodiments, capacitor $C_{P1}$ represents capacitor $C_{p1}$, capacitor $C_{P2}$ represents $Cp_2$-$Cpk$, capacitor $C_{N1}$ represents $C_{n1}$, and capacitor $C_{N2}$ represents $C_{n2\text{-}Cnk}$.

The comparator is coupled to compare an analog PDAC output signal on line 113-1 with an analog NDAC output signal on line 113-2 and to produce a comparator output signal on output line 736 indicative of a comparison result. The capacitor coupling switch circuitry 726, 728 is configured to selectably alternate back and forth, 'shuffle', the coupling of the capacitors within the PDAC 106 and the NDAC 108 between first and second coupling states indicated in Table 2. In the first coupling state capacitors $C_{P1}$ and $C_{P2}$ are coupled as part of a PDAC, and capacitors $C_{N1}$ and $C_{N2}$ are coupled as part of a NDAC. In the second coupling state capacitors $C_{P2}$ and $C_{N1}$ are coupled as part of a PDAC, and capacitors $C_{P1}$ and $C_{N2}$ are coupled as part of a NDAC.

TABLE 2

| First Coupling State | Second Coupling State |
| --- | --- |
| PDAC = $C_{P1}$ and $C_{P2}$ in parallel | PDAC = $C_{P2}$ and $C_{N1}$ in parallel |
| NDAC = $C_{N1}$ and $C_{N2}$ in parallel | NDAC = $C_{P1}$ and $C_{N2}$ in parallel |

A first capacitor coupling switch circuit 726 includes first and a second internal capacitor coupling switch circuits 726-1 and 726-2. The second capacitor coupling switch circuit 728 includes third and fourth internal capacitor coupling switch circuits 728-1 and 728-2. In the first coupling state, the first internal capacitor coupling switch 726-1 is closed in response to a first conversion switch control signal $\varphi_{conv1}$, to couple $C_{P1}$ and $C_{P2}$ in parallel, and the third internal capacitor coupling switch 728-1 is closed in response to the first conversion switch control signal $\varphi_{conv1}$, to couple $C_{N1}$ and $C_{N2}$ in parallel. In the first coupling state, the second and fourth internal capacitor coupling switches 726-2, 728-2 are open. In the second coupling state, the second internal capacitor coupling switch 726-2 is closed in response to a second conversion switch control signal $\varphi_{conv2}$, to couple $C_{P1}$ and $C_{N2}$ in parallel, and the fourth internal capacitor coupling switch 728-2 is closed in response to second conversion switch control signal $\Phi_{conv2}$, to couple $C_{P1}$ and $C_{N1}$ in parallel. In the second coupling state, the first and third internal capacitor coupling switches 726-1, 728-2 are open.

First and second differential signal pairs, (ip_p1 and ip_n1) and (ip_p2 and ip_n2), are produced based upon first and second analog input signals received by the multiplex circuit 704. The first differential signal pair includes positive and inverted representations, ip_p1 and ip_n1, of a first analog signal that is to be converted. The second differential signal pair includes positive and inverted representations, ip_p2 and ip_n2 of a second analog signal that is to be converted. In the following description, it is assumed that a received first analog signal, represented by differential pair, ip_p1 and ip_n1, is converted using the ADC 102 before a second received analog signal, represented by differential pair, ip_p2 and ip_n2, is converted using the ADC 102, for example.

The signal routing switching switches 704-1 to 704-4 are configured to selectably couple received differential signals to different combinations of the first through fourth capacitors $C_{P1}$, $C_{P2}$, $C_{N1}$ and $C_{N2}$.

First analog (continuous) signal routing switch 704-1 includes first switch circuitry 712-1, which in response to a first acquisition switch control signal $\varphi_{acq1}$, couples a positive version of the first analog input signal, ip_p1, to a capacitor plate of the first capacitor $C_{P1}$, and also includes second switch circuitry 714-1, which in response to a second first acquisition switch control signal $\varphi_{acq2}$, couples an inverted version of the second analog input signal ip_n2 to the capacitor plate of the first capacitor $C_{P1}$.

Second analog signal routing switch 704-2 includes first switch circuitry 712-2, which in response to the first acquisition switch control signal $\varphi_{acq1}$, couples the positive version of the first analog input signal, ip_p1, to a capacitor plate of the second capacitor $C_{P2}$, and also includes second switch circuitry 714-2, which in response to a second first acquisition switch control signal $\varphi_{acq2}$, couples a positive version of a second analog input signal ip_p2 to the capacitor plate of the second capacitor $C_{P2}$.

Third analog signal routing switch 704-3 includes first switch circuitry 712-3, which in response to the first acquisition switch control signal $\varphi_{acq1}$, couples the inverted version of the first analog input signal, ip_n1, to a capacitor plate of the third capacitor $C_{N1}$, and also includes second switch circuitry 714-3, which in response to the second first acquisition switch control signal $\varphi_{acq2}$, couples a positive version of the second analog input signal ip_p2 to the capacitor plate of the third capacitor $C_{N1}$.

Fourth analog signal routing switch 704-4 includes first switch circuitry 712-4, which in response to the first acquisition switch control signal $\varphi_{acq1}$, couples the inverted version of the first analog input signal, ip_n1, to a capacitor plate of the fourth capacitor $C_{N2}$, and also includes second switch circuitry 714-4, which in response to the second first acquisition switch control signal $\varphi_{acq2}$, couples the negative version of the second analog input signal ip_n2 to the capacitor plate of the fourth capacitor $C_{N2}$.

Figure 9:
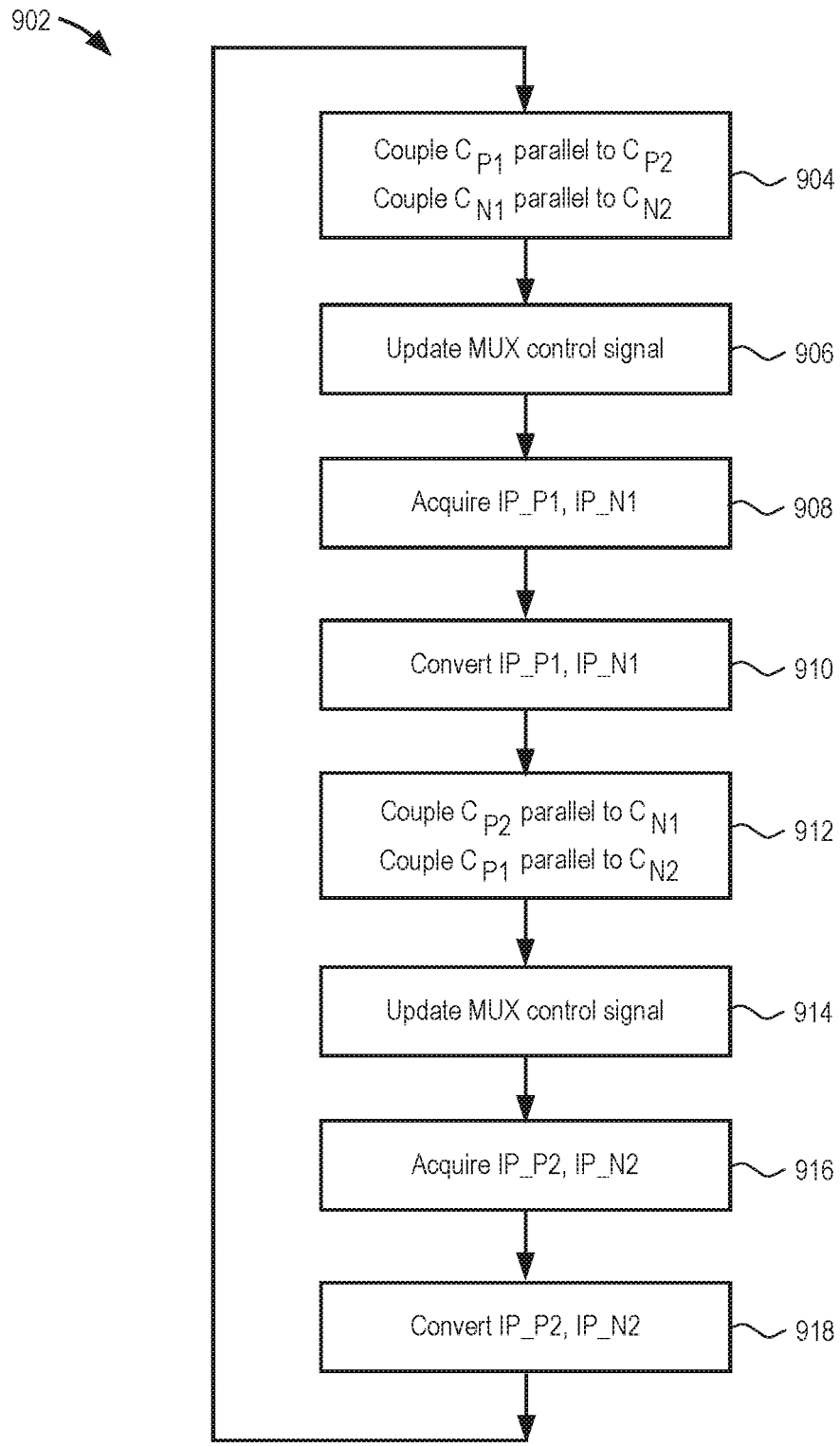
FIG. 9 is an illustrative flow diagram of a method representing operation of the ADC of FIG. 1 in accordance with some embodiments.

FIG. 9 is an illustrative flow diagram of a method 902 representing operation of the ADC 102 of the embodiment of FIG. 1 in accordance with some embodiments. In block 904, capacitors $C_{P1}$ and $C_{P2}$ are coupled in parallel to form PDAC, and capacitors $C_{N1}$ and $C_{N2}$ are coupled in parallel to form NDAC. In block 906, a first differential signal value pair ip_p1, ip_n1 is produced based upon a first analog signal received at multiplexer 704. In block 908, the first differential signal pair is acquired by the PDAC 106 and the NDAC 108. In block 910, the first differential value pair is converted to a first digital code. Conversion involves testing voltages across different combinations of capacitors within the PDAC 106 and the NDAC 108 to find a matching digital code. In block 912, capacitors $C_{P2}$ and $C_{N1}$ are coupled in parallel to form PDAC, and capacitors $C_{P1}$ and $C_{N2}$ are coupled in parallel to form NDAC. In block 914, a second differential signal value pair ip_p2, ip_n2 is produced based upon a second analog signal received at multiplexer 704. In block 916, the second differential signal pair is acquired by the PDAC 106 and the NDAC 108. In block 918, the second differential value pair is converted to a second digital code. Once again, conversion involves testing voltages across different combinations of capacitors within the PDAC 106 and the NDAC 108 to find a matching digital code. The process returns to block 904 for processing a next sequence of two analog signals.

Figure 10:
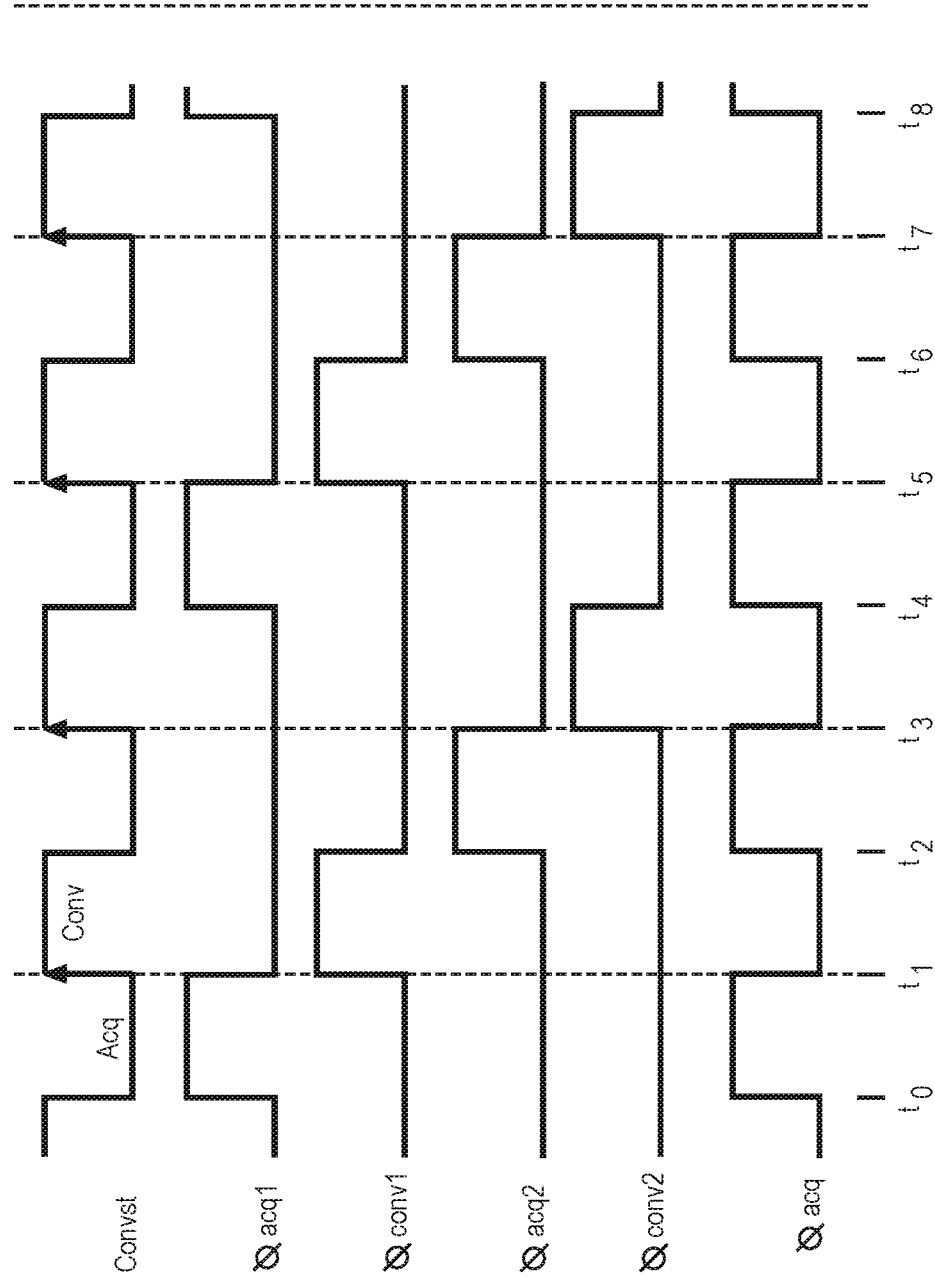
FIG. 10 is an illustrative signal timing diagram representing control signals to control the operation of the ADC of FIG. 1 in accordance with some embodiments.

FIG. 10 is an illustrative signal timing diagram representing control signals produced by switch control circuit 110 to control the operation of the ADC 102 of the embodiment of FIG. 1 in accordance with some embodiments. The control signals represent the circuit 110. A $\varphi_{acq1}$ signal has a time period that matches that of the Convst signal and that is phase shifted one hundred and eighty degrees from it. The $\varphi_{acq}$ signal includes an active portion (high) and an inactive portion (low). During each active portion, the acquisition signal $\varphi_{acq}$ causes bias control switches 742 close to couple first (top) plates of alternate capacitors $C_{P1}$ and $C_{P2}$ in the PDAC 106 and to couple first (top) plates of alternate capacitors $C_{N1}$ and $C_{N2}$ in the NDAC 108 to different fixed voltages $V_1$ and $V_2$, as shown, to generate common mode voltage ($V_{cm}$). Also, during each active portion, second (bottom) plates of the capacitors coupled to signals representing an analog input value to be converted. Continuing with the example above, these signals may include (ip_p1, ip_n1) or (ip_p2, ip_n2).

A Convst signal having a fixed time period alternates between an active portion (high) and an inactive portion (low). During each active portion, the Convst signal triggers in the DAC 102 a SAR bit search process in which bit test switches 744-1 to 744-4 act as selective shorting switches to selectively couple different combinations of second (bottom) plates of capacitors $C_{P1}$, $C_{P2}$, $C_{N1}$ and $C_{N2}$ between a reference voltage and a ground, according to a SAR bit search algorithm, to successively build up a multi-bit code that provides an approximate digital value for the received analog signal. Bit search algorithms are well known and need not be described herein. In some embodiments, an electronic circuit is configured to implement a SAR-P algorithm to control bit test switches of the PDAC 106, and the electronic circuit is configured to implement a SAR-N algorithm to control bit test switches of the NDAC 106.

During a first acquisition phase, which involves a first received analog signal and which occurs between times $t_0$ and $t_1$, the first acquisition switch control signal $\varphi_{acq1}$ has an active value (high) causing closure of switches 712-1 to 712-4, which couples differential signal ip_p1 to charge capacitors $C_{P1}$ and $C_{P2}$ and to couple differential signal values ip_n1 to charge capacitors $C_{N1}$ and $C_{N2}$.

During a first conversion phase, which involves the first received analog signal, which occurs between times $t_1$ and $t_2$, the first conversion switch control signal $\varphi_{conv1}$ has an active value (high) causing closure of the first and third internal capacitor coupling switches 726-1, 728-1, which couples capacitors $C_{P1}$ and $C_{P2}$ in parallel to form PDAC and couples capacitors $C_{N1}$ and $C_{N2}$ in parallel to form NDAC. After this, bottom plates of PDAC and NDAC are appropriately switched according to SAR algorithm to convert input into digital code in a usual manner.

During a second acquisition phase, which involves a second received analog signal and which occurs between times $t_2$ and $t_3$, the second acquisition switch control signal $\varphi_{acq2}$ has an active value (high) causing closure of switches 714-1 to 714-4, which couples differential signal ip_n1 to charge capacitors $C_{P1}$ and $C_{n2}$ and to couple differential signal values ip_p2 to charge capacitors $C_{P2}$ and $C_{N1}$.

During a second conversion phase, which involves the second received analog signal and which occurs between times $t_3$ and $t_4$, the second conversion switch control signal $\varphi_{conv2}$ has an active value (high) causing closure of the second and fourth internal capacitor coupling switches 726-2, 728-2, which couples capacitors $C_{P1}$ and $C_{N2}$ in parallel to form PDAC and couples capacitors $C_{P2}$ and $C_{N1}$ in parallel to form NDAC. After this, bottom plates of PDAC and NDAC are appropriately switched according to SAR algorithm to convert input into digital code in a usual manner.

Thus, after each acquisition-conversion cycle, the capacitors of the PDAC 106 and the NDAC 108 shuffle between the first and second capacitor states of Table 2. For example, during a first acquisition-conversion cycle, the capacitors are coupled according to the first capacitor state. During a second successive acquisition-conversion cycle, the capacitors are coupled according to the second capacitor state. During a third successive acquisition fourth third successive acquisition-conversion cycle, the capacitors are coupled according to the second capacitor state. etc.

With this shuffling of capacitor coupling, the effects of DA absorption in capacitors $C_{P1}$, $C_{P2}$, $C_{N1}$, $C_{N2}$ during one acquisition-conversion cycle in which the capacitors are coupled according one of the first or second capacitor states is substantially negated during a later acquisition-conversion cycle in which these same capacitors are coupled according to the other of the capacitor states. More particularly, for example, during operation in the second capacitor state, for example, residual DA effect in $C_{P2}$ and residual DA effect in $C_{N1}$ will cancel each other and translate to common mode voltage. Similarly, residual DA effect in $C_{P1}$ and residual DA effect in $C_{N2}$ will cancel each other and translate to common mode voltage. Thus, shuffling the coupling of the capacitors substantially reduces DA absorption effects that may be left over from a previous conversion.

Figure 11A:
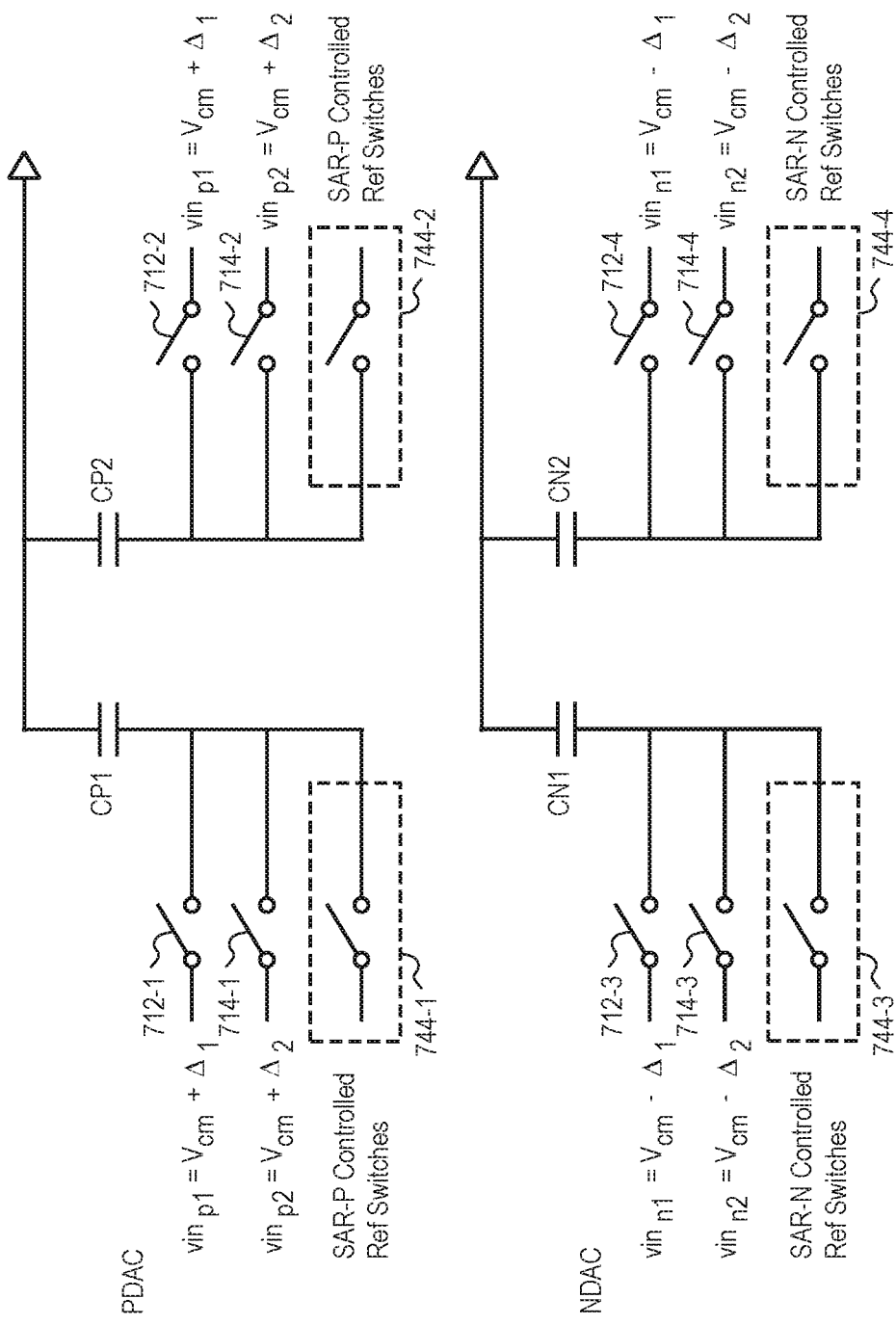
FIGS. 11A-11C are illustrative simplified drawings that represent the circuit of FIG. 1 and that show changing of connections between capacitors in PDAC and NDAC from one conversion to the next to reduce dielectric absorption effects of in in accordance with some embodiments.
Figure 11B:
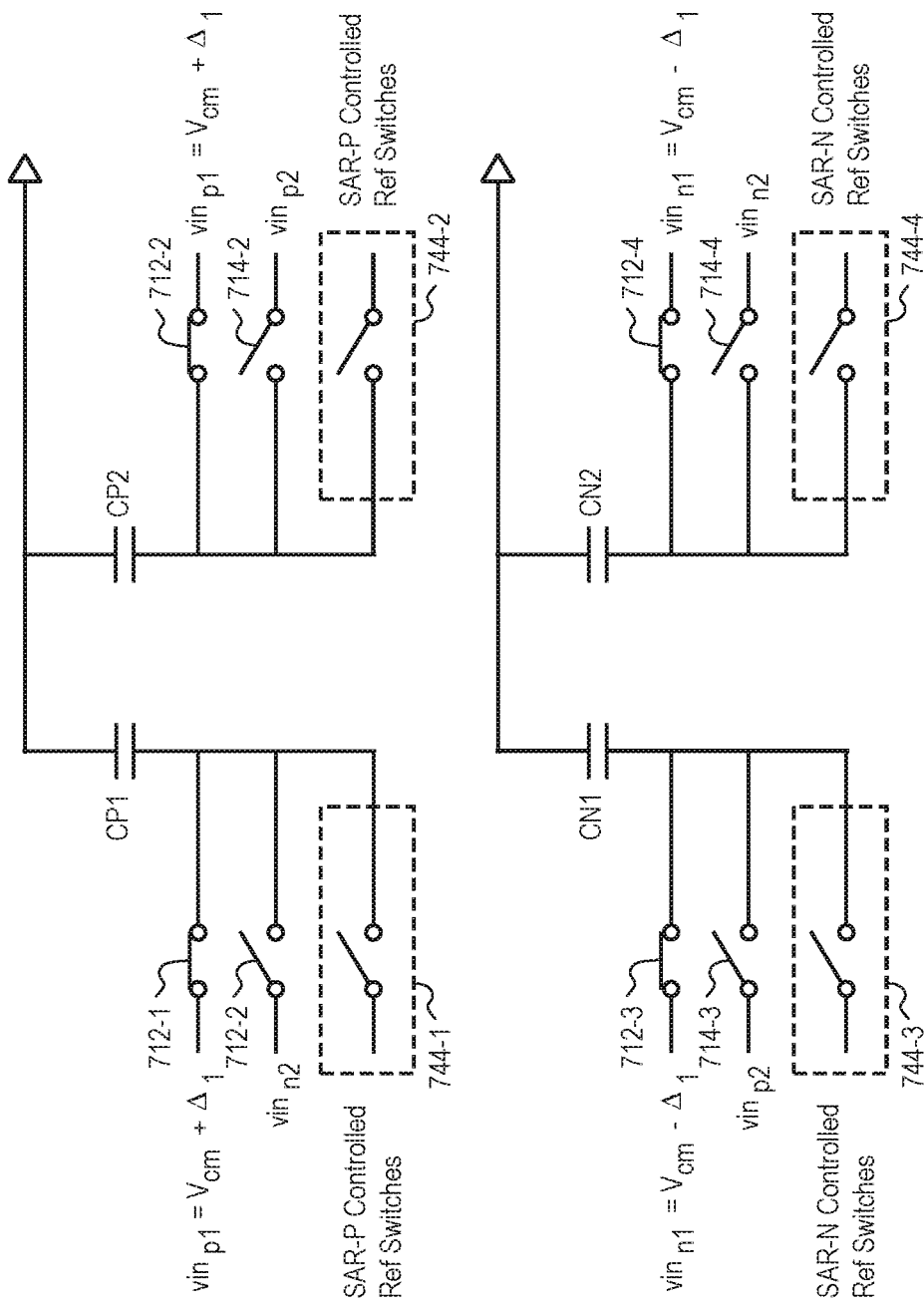
Figure 11C:
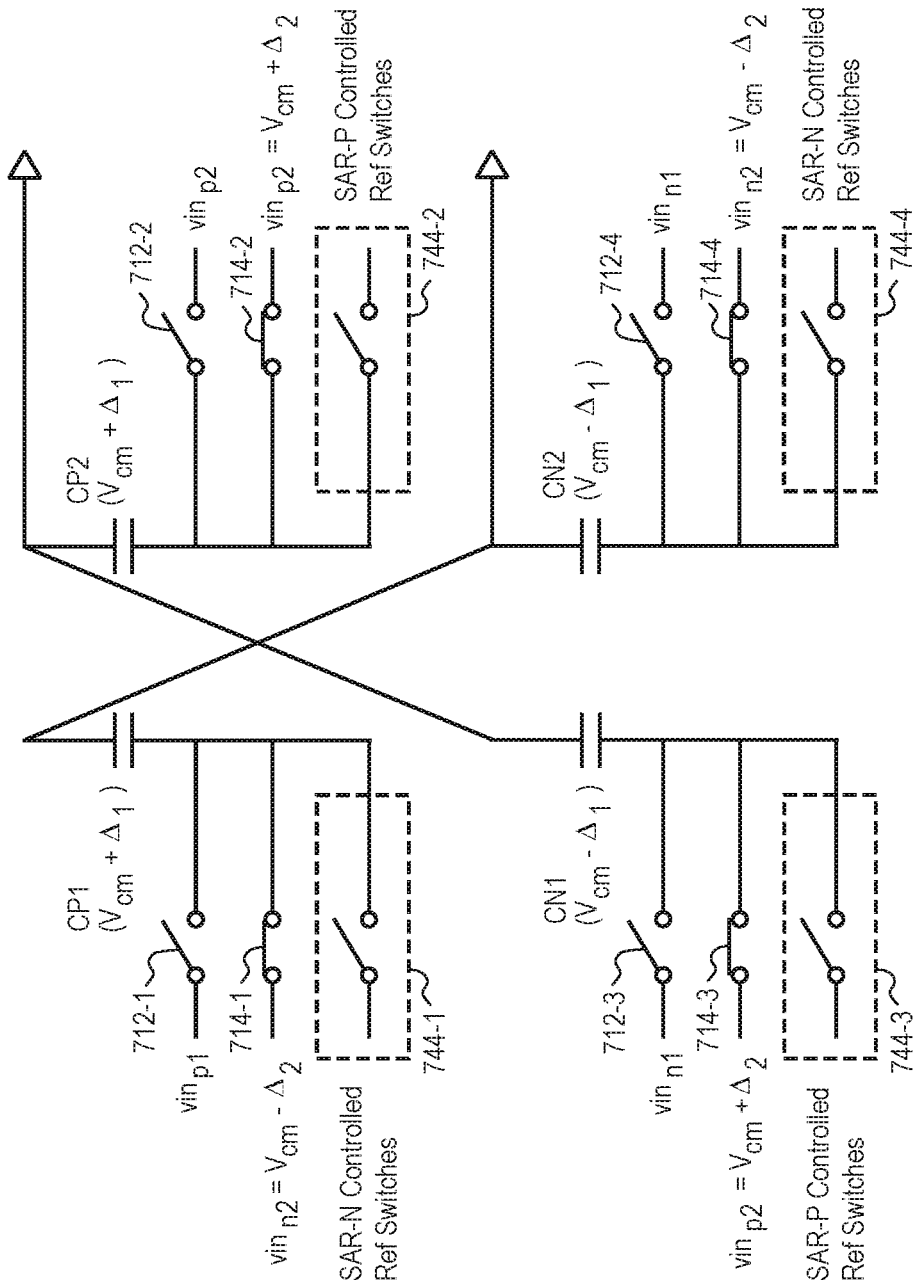

FIGS. 11A-11C are illustrative simplified drawings that represent the circuit of the embodiment of FIG. 8 and that show changing of connections between capacitors in PDAC and NDAC from one conversion to the next to reduce dielectric absorption effects of in in accordance with some embodiments. The illustrative drawing of FIG. 11A shows differential signal voltage values that have been received but have not yet acquired and converted. The value $V_{cm}$ represents a common mode voltage. A value $\Delta_1$ represents the voltage value of the first differential signal. A value $\Delta_2$ represents the voltage value of the second differential signal. A magnitude of the positive portion of the first differential signal pair $vin_{p1}$, is $V_{cm}+\Delta_1$. A magnitude of the negative portion of the first differential signal pair $vin_{n1}$, is $V_{cm}-\Delta_1$. A magnitude of the positive portion of the second differential signal pair $vin_{p2}$, is $V_{cm}+\Delta_2$. A magnitude of the negative portion of the second differential signal pair $vin_{n2}$, is $V_{cm}-\Delta_2$. These differential signal values are applied as shown to switches 712-1 to 712-4 and 714-1 to 714-4, which are shown in the open switch state prior to their acquisition and conversion. The SAR-P controlled switches and the SAR-N controlled switches are controlled according to the SAR bit search algorithm.

It is noted that in order to simplify the drawings and the explanation, details of top plate capacitor switch connections are not shown in FIGS. 11A-11C. It will be appreciated that top plates are coupled to a comparator input during conversion phase and are coupled to a known fixed reference voltage during a sampling stage.

The illustrative drawing of FIG. 11B represents acquisition and conversion of the first differential signal pair. First and third capacitive coupling switches 726-1, 728-1 are closed so as to couple the capacitors $C_{P1}$, $C_{P2}$, $C_{N1}$ and $C_{N2}$ in the first coupling state. Switch circuits 712-1, 712-2 are closed to apply the first positive differential value $vin_p i$ to second (bottom) capacitor plates of capacitors $C_{P1}$ and $C_{P2}$, respectively. Switch circuits 712-3, 712-4 are closed to apply first negative differential value $vin_{n1}$ to second (bottom) capacitor plates of capacitors $C_{N1}$ and $C_{N2}$, respectively. Switches 714-1 to 714-4 are open. During this first acquisition and conversion phase, Cp1 and Cp2 are treated as PDAC and $C_{N1}$ and $C_{N2}$ are treated as NDAC. The SAR algorithm controls the bottom plate switches of PDAC (744-1 and 744-2) and NDAC (744-3 and 744-4) to convert sampled input.

The illustrative drawing of FIG. 11C represents acquisition and conversion of the second differential signal pair. Second and fourth capacitive coupling switches 726-2, 728-2 are closed so as to couple the capacitors $C_{P1}$, $C_{P2}$, $C_{N1}$ and $C_{N2}$ in the second coupling state. Switch circuits 714-1, 714-2 are closed to apply the second positive differential value $vin_{p2}$ to second (bottom) capacitor plates of capacitors $C_{P2}$ and $C_{N1}$, respectively. Switch circuits 714-3, 714-4 are closed to apply second negative differential value $vin_{n2}$ to second (bottom) capacitor plates of capacitors $C_{P1}$ and $C_{N2}$, respectively. Switches 712-1 to 712-4 are open. During this second acquisition and conversion phase, Cp1 and $C_{N2}$ are treated as PDAC and $C_{N1}$ and $C_{P2}$ are treated as NDAC. The SAR algorithm controls the bottom plate switches of PDAC (744-2 and 744-3) and NDAC (744-1 and 744-4) to convert sampled input.

It will be appreciated that following the first acquisition and conversion represented by FIG. 11B, capacitors $C_{P1}$ and $C_{P2}$ each will have a residual DA effect caused by charge-discharge involving the positive differential signal value $Vin_{p1}=V_{cm}+\Delta_1$, and that capacitors $C_{N1}$ and $C_{N2}$ each will have a residual DA effect caused by charge discharge involving the negative differential signal value $Vin_{n1}=V_{cm}-\Delta_1$. During the second acquisition and conversion represented by FIG. 11C, the residual DA effects on $C_{P1}$ and $C_{N2}$ will cancel and translate to common mode. Similarly, during the second acquisition and conversion, the residual DA effects on $C_{P2}$ and $C_{N1}$ will cancel and translate to common mode. Thus the effect of DA left over from the first acquisition and conversion upon the second acquisition and conversion is minimized.

The foregoing description and drawings is presented to enable any person skilled in the art to create and use an apparatus and method to reduce the effect of dielectric absorption in a SAR ADC and is merely illustrative of the principles of the invention. For example, digital correction can be used with a single ended SAR ADC that includes only as single binary weighted capacitor array. Various modifications to the embodiments will be readily apparent to those skilled in the art, and the generic principles defined herein may be applied to other embodiments and applications without departing from the spirit and scope of the invention. Numerous details are set forth for the purpose of explanation. However, one of ordinary skill in the art will realize that the invention might be practiced without the use of these specific details. In other instances, well-known processes are shown in block diagram form in order not to obscure the description of the invention with unnecessary detail. Identical reference numerals may be used to represent different views of the same or similar item in different drawings. Flow diagrams in drawings referenced below are used to represent processes. Therefore, it will be understood that various modifications can be made to the embodiments by those skilled in the art without departing from the spirit and scope of the invention, which is defined in the appended claims.

The invention claimed is:

1. A successive approximation analog to digital converter comprising:
    a positive digital to analog converter (PDAC) comprising a PDAC capacitor and a negative digital to analog converter (NDAC) comprising an NDAC capacitor, the PDAC and NDAC being configured to provide respective test signals in response to multiple analog input signals; and
    control switch circuitry configured to switch between coupling a first capacitor in parallel with the PDAC capacitor of the PDAC at a first point in time, such that a first terminal of the first capacitor is connected to a first terminal of the PDAC capacitor and a second terminal of the first capacitor is connected to a first reference voltage to which a second terminal of the PDAC capacitor is connected, and coupling the first capacitor in parallel with the NDAC capacitor of the NDAC at a second point in time, such that the first terminal of the first capacitor is connected to a first terminal of the NDAC capacitor and the second terminal of the first capacitor is connected to a second reference voltage to which a second terminal of the NDAC capacitor is connected, after respective conversions by the PDAC and NDAC of a selected one of the analog input signals to the respective test signals, the first capacitor being coupled one at a time either to the PDAC or the NDAC.

2. The converter of claim 1, wherein the first capacitor is coupled, by the control switch circuitry, to the PDAC after a first conversion, wherein the first capacitor is coupled, by the control switch circuitry, to the NDAC after a second conversion, and wherein the converter includes a differential comparator, further including:
    a control circuit coupled to receive comparison signals provided from the differential comparator and to provide control signals to cause the control switch circuitry to switch coupling the first capacitor between respective conversions by the PDAC and NDAC.

3. The converter of claim 1, wherein the control switch circuitry is further configured to switch between coupling a second capacitor to the PDAC and coupling of the second capacitor to the NDAC after each conversion by the PDAC and NDAC, wherein the control switch circuitry is configured to selectably switch the first capacitor and the second capacitor between the coupling to the PDAC and the NDAC.

4. The converter of claim 3, wherein the PDAC and the NDAC are in:
a first coupling state in which the PDAC includes the first capacitor and a third capacitor and the NDAC includes the second capacitor and a fourth capacitor, and
a second coupling state in which the PDAC includes the fourth capacitor and the second capacitor and the NDAC includes the third capacitor and the first capacitor.

5. The converter of claim 1, wherein the control switch circuitry includes:
first analog signal routing circuitry to couple a positive version of a first analog signal to the first capacitor in a first coupling state and to couple an inverted version of a second analog signal to the first capacitor in a second coupling state.

6. The converter of claim 4, wherein the switch control circuitry includes:
first analog signal routing circuitry to couple a positive version of a first analog signal to the third capacitor in the first coupling state and to couple an inverted version of a second analog signal to the third capacitor in the second coupling state;
second analog signal routing circuitry to couple the positive version of the first analog signal to the fourth capacitor in the first coupling state and to couple the inverted version of the second analog signal to the fourth capacitor in the second coupling state; and
third analog signal routing circuitry to couple the positive version of the first analog signal to the second capacitor in the first coupling state and to couple the inverted version of the second analog signal to the second capacitor in the second coupling state.

7. The converter of claim 4, wherein:
a capacitance value of the first capacitor substantially matches a capacitance value of the third capacitor; and
a capacitance value of the fourth capacitor substantially matches a capacitance value of the second capacitor.

8. The converter of claim 1, wherein:
the PDAC includes a binary weighted capacitor array;
the NDAC includes a binary weighted capacitor array;
the PDAC and the NDAC are equivalent; and
the first capacitor includes one or more capacitors that together have a capacitance equal to approximately one-half of a total capacitance of the binary weighted capacitor array of the PDAC.

9. The converter of claim 8 further comprising a second capacitor, second capacitor switched between being coupled to the PDAC and being coupled to the NDAC, wherein the second capacitor includes one or more capacitors that together have a capacitance equal to approximately one-half of a total capacitance of the binary weighted capacitor array of the NDAC.

10. A method for reducing dielectric absorption of a successive approximation register analog to digital converter (SAR ADC) that includes a positive digital to analog converter (PDAC) and a negative digital to analog converter (NDAC), the PDAC comprising a PDAC capacitor and the NDAC comprising an NDAC capacitor, the method comprising:
selecting different analog signals from among multiple analog signals;
converting an analog signal that is selected from among the multiple analog signals to a sequence of digital code bits; and
switching between coupling a first capacitor in parallel with the PDAC capacitor of the PDAC at a first point in time, such that a first terminal of the first capacitor is connected to a first terminal of the PDAC capacitor and a second terminal of the first capacitor is connected to a first reference voltage to which a second terminal of the PDAC capacitor is connected, and coupling of the first capacitor in parallel with the NDAC capacitor of the NDAC at a second point in time, such that the first terminal of the first capacitor is connected to a first terminal of the NDAC capacitor and the second terminal of the first capacitor is connected to a second reference voltage to which a second terminal of the NDAC capacitor is connected, after respective conversions of the selected analog signal by the PDAC and NDAC, the first capacitor being coupled one at a time either to the PDAC or the NDAC.

11. The method of claim 10, wherein the first capacitor is coupled to the PDAC after a first conversion, wherein the first capacitor is coupled to the NDAC after a second conversion, and wherein the PDAC includes a binary weighted capacitor array, and wherein switching between coupling the first capacitor includes switching between coupling one or more capacitors that together have a capacitance equal to approximately one-half of a total capacitance of the binary weighted capacitor array of the PDAC.

12. The method of claim 10, further including switching between coupling a second capacitor to the PDAC and coupling of the second capacitor to the NDAC after each conversion, wherein switching between coupling the second capacitor includes switching between coupling one or more capacitors that together have a capacitance that is about one-half of a total capacitance of a binary weighted capacitor array that comprises the NDAC.

13. The method of claim 10, wherein the PDAC and the NDAC are in:
a first coupling state in which the PDAC includes the first capacitor and a third capacitor and the NDAC includes a second capacitor and a fourth capacitor, and a second coupling state in which the PDAC includes the fourth capacitor and the second capacitor and the NDAC includes the third capacitor and the first capacitor.

14. The method of claim 10 further comprising:
coupling a positive version of a first analog signal to the first capacitor in a first coupling state; and
coupling an inverted version of a second analog signal to the first capacitor in a second coupling state.

15. The method of claim 13 further comprising:
coupling a positive version of a first analog signal to the third capacitor in the first coupling state;
coupling an inverted version of a second analog signal to the third capacitor in the second coupling state;
coupling the positive version of the first analog signal to the fourth capacitor in the first coupling state;
coupling the inverted version of the second analog signal to the fourth capacitor in the second coupling state;
coupling the positive version of the first analog signal to the second capacitor in the first coupling state; and coupling the inverted version of the second analog signal to the second capacitor in the second coupling state.

16. An apparatus reducing dielectric absorption of a successive approximation register analog to digital converter (SAR ADC) that includes a positive digital to analog converter (PDAC) and a negative digital to analog converter (NDAC), the PDAC comprising a PDAC capacitor and the NDAC comprising an NDAC capacitor, the apparatus comprising:
  means for selecting different analog signals from among multiple analog signals;
  means for converting an analog signal selected from among the multiple analog signals to a sequence of digital code bits; and
  means for switching between coupling a first capacitor in parallel with the PDAC capacitor of the PDAC at a first point in time, such that a first terminal of the first capacitor is connected to a first terminal of the PDAC capacitor and a second terminal of the first capacitor is connected to a first reference voltage to which a second terminal of the PDAC capacitor is connected, and coupling of the first capacitor in parallel with the NDAC capacitor of the NDAC at a second point in time, such that the first terminal of the first capacitor is connected to a first terminal of the NDAC capacitor and the second terminal of the first capacitor is connected to a second reference voltage to which a second terminal of the NDAC capacitor is connected, after respective conversions of the selected analog signal by the PDAC and NDAC, the first capacitor being coupled one at a time either to the PDAC or the NDAC.

17. The apparatus of claim 16, wherein the first capacitor is coupled to the PDAC after a first conversion, wherein the first capacitor is coupled to the NDAC after a second conversion, and wherein the PDAC includes a binary weighted capacitor array, and wherein means for switching between coupling the first capacitor includes means for switching between coupling one or more capacitors that together have a capacitance equal to approximately one-half of a total capacitance of the binary weighted capacitor array of the PDAC.

18. The apparatus of claim 16 further including means for switching between coupling a second capacitor to the PDAC and coupling of the second capacitor to the NDAC after each conversion, wherein means for switching between coupling the second capacitor includes means for switching between coupling one or more capacitors that together have a capacitance that is about one-half of a total capacitance of a binary weighted capacitor array that comprises the NDAC.

19. The apparatus of claim 16, wherein the PDAC and the NDAC are in:
  a first coupling state in which the PDAC includes the first capacitor and a third capacitor and the NDAC includes a second capacitor and a fourth capacitor, and
  a second coupling state in which the PDAC includes the fourth capacitor and the second capacitor and the NDAC includes the third capacitor and the first capacitor.

20. The apparatus of claim 16 further comprising:
  means for coupling a positive version of a first analog signal to a third capacitor in a first coupling state;
  means for coupling an inverted version of a second analog signal to the third capacitor in a second coupling state;
  means for coupling the positive version of the first analog signal to a fourth capacitor in the first coupling state;
  means for coupling the inverted version of the second analog signal to the fourth capacitor in the second coupling state;
  means for coupling the positive version of the first analog signal to a second capacitor in the first coupling state; and
  means for coupling the inverted version of the second analog signal to the second capacitor in the second coupling state.

* * * * *